United States Patent
Cook et al.

(10) Patent No.: US 10,700,711 B1
(45) Date of Patent: Jun. 30, 2020

(54) MULTI-PART UPLOAD AND EDITING OF ERASURE-CODED OBJECTS

(71) Applicant: Caringo, Inc., Austin, TX (US)

(72) Inventors: Thomas William Cook, Georgetown, TX (US); Andrew David Klager, Austin, TX (US); Tom Teugels, Antwerp (BE); Patrick Murphy Ray, Austin, TX (US); Donald George Baker, Austin, TX (US)

(73) Assignee: CARINGO INC., Austin, TX (US)

( * ) Notice: Subject to any disclaimer, the term of this patent is extended or adjusted under 35 U.S.C. 154(b) by 132 days.

(21) Appl. No.: 16/179,534

(22) Filed: Nov. 2, 2018

Related U.S. Application Data

(60) Provisional application No. 62/581,255, filed on Nov. 3, 2017.

(51) Int. Cl.
| | | |
|---|---|---|
| *H03M 13/15* | (2006.01) | |
| *H03M 13/23* | (2006.01) | |
| *G06F 16/27* | (2019.01) | |
| *G06F 16/18* | (2019.01) | |

(Continued)

(52) U.S. Cl.
CPC ....... *H03M 13/154* (2013.01); *G06F 11/1076* (2013.01); *G06F 16/1805* (2019.01); *G06F 16/27* (2019.01); *G06F 16/289* (2019.01); *H03M 13/235* (2013.01)

(58) Field of Classification Search
CPC ... H03M 13/154; H03M 13/235; G06F 16/27; G06F 16/289; G06F 11/1076; G06F 16/1805
See application file for complete search history.

(56) References Cited

U.S. PATENT DOCUMENTS

| | | |
|---|---|---|
| 5,978,791 A | 11/1999 | Farber et al. |
| 6,415,280 B1 | 7/2002 | Farber et al. |
| 6,922,766 B2 | 7/2005 | Scott |

(Continued)

OTHER PUBLICATIONS

Ray, S., Blanco, R. & Goel, A.K. High performance location-based services in a main-memory database. Geoinformatica 21, 293-322 (2017). https://doi.org/10.1007/s10707-016-0278-6 (Year: 2017).*

(Continued)

*Primary Examiner* — Cynthia Britt
(74) *Attorney, Agent, or Firm* — Beyer Law Group LLP

(57) ABSTRACT

Segments of a local range can appear multiple times in the sequence of erasure sets in a manifest without the data being duplicated. A subset of the content of an erasure set can be included in the logical object. It is not required that all erasure sets in an object use the same encoding. A manifest can indicate one or more portions of the logical object for which no data has been provided, and for which a "fill" pattern is specified. A portion of data can be inserted at any point inside the object by inserting a reference to one or more segment sets containing that data into the manifest. If the desired insertion point is within an existing segment set, then that manifest set can be "split" by incorporating two references to it, with the first specifying the range of data before the insertion point, and the second specifying the range of data after the insertion point. Many operations are thus enabled on an erasure-coded object in Object Storage such as "append", "insert," "overwrite" and "merge."

27 Claims, 21 Drawing Sheets

Append Operation

(51) Int. Cl.
*G06F 16/28* (2019.01)
*G06F 11/10* (2006.01)

(56) References Cited

U.S. PATENT DOCUMENTS

| | | | |
|---|---|---|---|
| 6,928,442 | B2 | 8/2005 | Farber et al. |
| 7,373,345 | B2 | 5/2008 | Carpentier et al. |
| 7,681,105 | B1 | 3/2010 | Sim-Tang et al. |
| 7,734,603 | B1 | 6/2010 | McManis |
| 7,802,310 | B2 | 9/2010 | Farber et al. |
| 7,945,539 | B2 | 5/2011 | Farber et al. |
| 7,945,544 | B2 | 5/2011 | Farber et al. |
| 7,949,662 | B2 | 5/2011 | Farber et al. |
| 7,979,645 | B2 | 7/2011 | Motohashi |
| 8,001,096 | B2 | 8/2011 | Farber et al. |
| 9,325,791 | B1 | 4/2016 | Blahaerath et al. |
| 10,120,579 | B1* | 11/2018 | Patiejunas ............. G06F 3/0676 |
| 2002/0169938 | A1 | 11/2002 | Scott et al. |
| 2003/0135700 | A1 | 7/2003 | Schultz et al. |
| 2004/0255002 | A1 | 12/2004 | Kota et al. |
| 2004/0260906 | A1 | 12/2004 | Landin et al. |
| 2005/0005074 | A1 | 1/2005 | Landin et al. |
| 2005/0044340 | A1 | 2/2005 | Sheets et al. |
| 2006/0069899 | A1 | 3/2006 | Schoinas et al. |
| 2007/0271313 | A1 | 11/2007 | Mizuno |
| 2008/0247355 | A1 | 10/2008 | Ahn |
| 2009/0089537 | A1 | 4/2009 | Vick et al. |
| 2009/0228511 | A1 | 9/2009 | Atkin et al. |
| 2009/0006888 | A1 | 11/2009 | Bernhard et al. |
| 2010/0070515 | A1 | 3/2010 | Dutton et al. |
| 2011/0029840 | A1 | 2/2011 | Ozzie et al. |
| 2011/0040568 | A1 | 2/2011 | Dutton et al. |
| 2011/0138136 | A1 | 6/2011 | Shitomi et al. |
| 2011/0154092 | A1 | 6/2011 | Dash et al. |
| 2011/0167045 | A1 | 7/2011 | Okamoto |
| 2012/0042202 | A1 | 2/2012 | Wenzel |
| 2012/0047111 | A1 | 2/2012 | Hayden et al. |
| 2012/0060072 | A1 | 3/2012 | Simitci et al. |
| 2012/0066337 | A1 | 3/2012 | Wu et al. |
| 2013/0339818 | A1* | 12/2013 | Baker ................. H03M 13/356 714/763 |
| 2014/0059315 | A1 | 2/2014 | Iwashita |
| 2014/0229455 | A1 | 8/2014 | Bestler et al. |
| 2014/0368945 | A1 | 12/2014 | Blount |
| 2015/0112935 | A1 | 4/2015 | French |
| 2015/0350316 | A1 | 12/2015 | Calder et al. |
| 2015/0363269 | A1* | 12/2015 | Baker ................... G06F 3/0632 714/766 |
| 2016/0057229 | A1 | 2/2016 | Barton |
| 2016/0170657 | A1 | 6/2016 | Suehr et al. |
| 2018/0034892 | A1* | 2/2018 | Olsen ................ H04L 65/4023 |
| 2018/0039543 | A1* | 2/2018 | Luby ..................... G06F 3/064 |
| 2018/0101462 | A1* | 4/2018 | De Schrijver ...... G06F 11/1076 |
| 2018/0284987 | A1* | 10/2018 | Lazier .................. G06F 3/0613 |
| 2019/0250989 | A1* | 8/2019 | Huang .................. G06F 3/064 |

OTHER PUBLICATIONS

S. Koh et al., "Understanding system characteristics of online erasure coding on scalable, distributed and large-scale SSD array systems," 2017 IEEE International Symposium on Workload Characterization (IISWC), Seattle, WA, 2017, pp. 76-86. (Year: 2017).*

Y. Tang et al., "MICS: Mingling Chained Storage Combining Replication and Erasure Coding," 2015 IEEE 34th Symposium on Reliable Distributed Systems (SRDS), Montreal, QC, 2015, pp. 192-201. (Year: 2015).*

M. K. Aguilera, R. Janakiraman and L. Xu, "Using erasure codes efficiently for storage in a distributed system," 2005 International Conference on Dependable Systems and Networks (DSN'05), Yokohama, Japan, 2005, pp. 336-345. (Year: 2005).*

International Search Report in PCT/US2013/44042 dated Aug. 30, 2013.

Written Opinion in PCT/US2013/44042 dated Aug. 30, 2013.

International Search Report in PCT/US2013/44045 dated Sep. 25, 2013.

Written Opinion in PCT/US2013/44045 dated Sep. 25, 2013.

Notice of Allowance in U.S. Appl. No. 13/517,525, dated Apr. 4, 2014.

Office Action in U.S. Appl. No. 13/517,523, dated May 15, 2014.

International Search Report in PCT/US2013/043904 dated Oct. 10, 2013.

Written Opinion in PCT/US2013/043904 dated Oct. 10, 2013.

International Search Report for PCT/US2017/044241, dated Nov. 7, 2017.

Written Opinion of the International Searching Authority for PCT/US2017/044241, dated Nov. 7, 2017.

* cited by examiner

| Metadata 310 | Zfec 1.4 | | ~ 312 |
|---|---|---|---|
| | 5:7 | | ~ 314 |
| | 32,000 | | ~ 316 |
| Erasure Set One 340 | Set Size | 1,000 | ~ 342 |
| | Encoding | 5:7 | ~ 344 |
| | Segment Width | 32k | ~ 346 |
| | Segment Size | 296,112 | ~ 348 |
| | Segment UUIDs | | |
| | abcdef1234567890<br>1234567890abcdef<br>abcdef123abc4567<br>⋮ | | ~ 350 |

300

Erasure Coding Manifest

*FIG. 3*

Erasure Set Example

Append Operation

Erasure Sets After Append Operation

| Metadata 570 | Zfec 1.4 | | ~572 |
|---|---|---|---|
| | 2:3 | | ~574 |
| | 32,000 | | ~576 |
| Erasure Set One 580 | Set Size | 6,000 | ~582 |
| | Encoding | 2:3 | ~584 |
| | Segment Width | 32k | ~586 |
| | Segment Size | 296,112 | ~588 |
| | Segment UUIDs | | |
| | abcdef1234567890<br>1234567890abcdef<br>abcdef123abc4567 | | ~589 |
| Erasure Set Two 590 | Set Size | 6,000 | ~592 |
| | Encoding | 2:3 | ~594 |
| | Segment Width | 32k | ~596 |
| | Segment Size | | ~598 |
| | Segment UUIDs | | |
| | abcdef1234567abc<br>1234567890abc012<br>abcdef123abc4abc | | ~599 |

Erasure Coding Manifest After Append Operation

*FIG. 7*

Insert Operation

Erasure Sets After Insert Operation

| Metadata 670 | Zfec 1.4 | 672 |
| --- | --- | --- |
| | 2:3 | 674 |
| | 32,000 | 676 |

| Erasure Set One 580 | Set Size 6,000 | 582 |
| --- | --- | --- |
| | Data Size 6,000 | 682 |
| | Segment UUIDS | 589 |

| Erasure Set Two 590 | Set Size 6,000 | 592 |
| --- | --- | --- |
| | Data Size 1,500 | 692 |
| | Segment UUIDS | 599 |

| Erasure Set Three 680 | Set Size 2,000 | 693 |
| --- | --- | --- |
| | Data Size 2,000 | 695 |
| | Segment UUIDS | 699 |

| Erasure Set Four 590' | Set Size 6,000 | 592 |
| --- | --- | --- |
| | Data Size 6,000 | 694 |
| | Start 1,500 | 696 |
| | Segment UUIDS | 599 |

Erasure Coding Manifest After Insert Operation

*FIG. 10*

Erasure Sets After Overwrite Operation

| Metadata 770 | Zfec 1.4 | ~772 |
|---|---|---|
| | 2:3 | ~774 |
| | 32,000 | ~776 |
| Erasure Set One 580' | Set Size 6,000 | ~582 |
| | Data Size 6,000 | ~782 |
| | Segment UUIDS | ~589 |
| Erasure Set Five 780 | Set Size 6,000 | ~742 |
| | Data Size 6,000 | ~744 |
| | Segment UUIDS | ~750 |
| Erasure Set Two 590'' | Set Size 6,000 | ~592 |
| | Data Size 3,000 | ~792 |
| | Start 3,000 | ~794 |
| | Segment UUIDS | ~599 |

Erasure Coding Manifest After Overwrite Operation

*FIG. 13*

Merge Operation

Erasure Sets After Merge Operation

| | | |
|---|---|---|
| Metadata 870 | Zfec 1.4 | 872 |
| | 2:3 | 874 |
| | 32,000 | 876 |
| Erasure Set Six 840 | Set Size 6,000 | 882 |
| | Data Size 6,000 | 884 |
| | Segment UUIDS | 886 |
| | | |
| Erasure Set Five 850 | Set Size 6,000 | 892 |
| | Data Size 3,000 | 894 |
| | Segment UUIDS | 896 |
| | | |

Erasure Coding Manifest After Merge Operation

*FIG. 16*

```
{
  "type":"erasure_encoded",
  "metadata":{"Content-Length": ["5100"] },
  "erasureSets": [
  {"segments": [     {"uuid":"1b3ceb859bce2f1583c3e76269232672"},
                     {"uuid":"90563d59d341d433b45c6d25998457ef"},
                     {"uuid":"695b7536208be0efa60b4ae4f1f59d51"},
             "size":100, "encoding": ["zfec 1.4", 2, 1, 524288, 200000000]},
  {"segments": [], "size": 900, "encoding": []},
  {"segments": [     {"uuid":"fea85f995cac8fcae0bc1aa717e44926"},
                     {"uuid":"953b00c5bi5d035f36ca8486d19b64c1"},
                     {"uuid":"2de11b28cc4c28c1c21eee7d338c39c4"},
             "size":200, "encoding": ["zfec 1.4", 2, 1, 524288, 200000000]},
  {"segments": [], "size": 3800, "encoding": []},
  {"segments": [     {"uuid":"fea85f995cac8fcae0bc1aa717e44927"},
                     {"uuid":"953b00c5bi5d035f36ca8486d19b64c2"},
                     {"uuid":"2de11b28cc4c28c1c21eee7d338c39c5"},
             "size":100, "encoding": ["zfec 1.4", 2, 1, 524288, 200000000]},
  ]
}
```

Example Manifest for a Sparse Object

*FIG. 17*

Multi-Port Upload System

Temporary Part Order Manifest 110  120  130  140

| Id: 11 | Start:0I | Size: 262144I | Guid: bbaa8eaaf9f1575acee76573d3f85bd9 |
| Id: 8 | Start:262144I | Size: 262144I | Guid: 234ef7d01a9a7b817e5f38615064507c |
| Id: 3 | Start:524288I | Size: 262144I | Guid: 593358bd04b69c2ec6c7b6a9980d64c3 |
| Id: 7 | Start:786432I | Size: 262144I | Guid: 18077e9b3feed4e39d19593e6f0113d7 |
| Id: 4 | Start:1048576I | Size: 262144I | Guid: c5a17951c655421b8d45bfb75e4a9565 |
| Id: 10 | Start:1310720I | Size: 262144I | Guid: ccc2c4cac06ba460274396ecff185e83 |
| Id: 6 | Start:1572864I | Size: 262144I | Guid: fadfef1eeacf57b54a2a04fcddc4a6a7 |
| Id: 5 | Start:1835008I | Size: 262144I | Guid: de468a822ff523be31b562dad1f194ed |
| Id: 9 | Start:2097152I | Size: 262144I | Guid: daa00e3d576940b41749ba982c89608c |
| Id: 1 | Start:2359296I | Size: 262144I | Guid: 2b3c17c6ce4cef21383fb9ad3259e7ed |
| Id: 15 | Start:2883584I | Size: 262144I | Guid: 9e4368a8588c50b3d6d1422c0331489b |
| Id: 14 | Start:3145728I | Size: 262144I | Guid: 866648c2384f86dbb8fb73ff0a5fd5a1 |
| Id: 13 | Start:3407872I | Size: 262144I | Guid: 82925def867bdb3d46a90e40eae85b3d |

```
{
    "parts": [
        {
            "partNumber": 11,
            "uuid": "bbaa8eaaf9f1575acee76573d3f85bd9"
        },
        {
            "partNumber": 8,
            "uuid": "234ef7d01a9a7b817e5f38615064507c"
        },
        {
            "partNumber": 3,
            "uuid": "593358bd04b69c2ec6c7b6a9980d64c3"
        },
        {
            "partNumber": 7,
            "uuid": "18077e9b3feed4e39d19593e6f0113d7"
        },
        {
            "partNumber": 4,
            "uuid": "c5a17951c655421b8d45bfb75e4a9565"
        },
        {
            "partNumber": 10,
            "uuid": "ccc2c4cac06ba460274396ecff185e83"
        },
        {
            "partNumber": 6,
            "uuid": "fadfef1eeacf57b54a2a04fcddc4a6a7"
        },
        {
            "partNumber": 5,
            "uuid": "de468a822ff523be31b562dad1f194ed"
        },
        {
            "partNumber": 9,
            "uuid": "daa00e3d576940b41749ba982c89608c"
        },
        {
            "partNumber": 1,
            "uuid": "2b3c17c6ce4cef21383fb9ad3259e7ed"
        },
        {
            "partNumber": 15,
```

*FIG. 20*

MULTI-PART UPLOAD AND EDITING OF ERASURE-CODED OBJECTS

CROSS-REFERENCE TO RELATED APPLICATIONS

This application claims priority of U.S. Provisional Patent Application No. 62/581,255, filed Nov. 3, 2017, entitled "MULTI-PART UPLOADS AND EDITING OF ERASURE CODED OBJECTS," which is hereby incorporated by reference.

This application is related to U.S. patent application Ser. Nos. 13/517,527 and 15/661,851, entitled "ERASURE CODING AND REPLICATION IN STORAGE CLUSTERS" and "MULTI-PART UPLOAD" which are both hereby incorporated by reference.

FIELD OF THE INVENTION

The present invention relates generally to multi-part uploading of objects to storage and to erasure coding of objects in storage. More specifically, the present invention relates to a combination of erasure coding and multi-part object upload.

BACKGROUND OF THE INVENTION

Traditionally, storage provided in a storage cluster is made reliable against hardware failure through erasure coding of stored objects. Although erasure coding enjoys the benefit of a smaller storage footprint and less overhead for similar level of protection against media failures (highly efficient), it represents a challenge when the data it contains must be updated, particularly in situations where data must be overwritten or inserted at a point other than at the end. Current implementations require copying of large amounts of data to construct the resulting, modified object. Such copying can be slow, as well as requiring large amounts of memory or storage.

Accordingly, improved techniques are desired for use with storage clusters in order to address the above problems.

SUMMARY OF THE INVENTION

To achieve the foregoing, and in accordance with the purpose of the present invention, a storage cluster is disclosed that allows objects in Object Storage to be edited or updated more efficiently.

A digital object may be stored in Object Storage using a technique known as erasure coding in which the object may be stored using one or more erasure sets. The term erasure set typically has had two meanings. In an erasure-coding (EC) manifest, an erasure set is the description of a logical range of data, which is contained within a single group of physical erasure-coded segments (along with their encoding specifier and logical size) or contained within a specified fill byte and logical size.

An erasure set can also refer to the physical group of segments themselves(data and parity) and that are encoded together. Previously these two concepts were synonymous, since the erasure set saved on disk had a one-to-one correspondence to the erasure set in the manifest. In the present invention, however, each erasure set on disk can correspond to enumerable sets in the manifest. A different portion of the physical erasure set can be used for each manifest erasure set, or the same portion of the physical erasure set can be used for multiple manifest erasure sets.

A typical multi-part object (as utilized by the Amazon S3 multi-part upload API, for example) requires a part for each logical range, in order, with no gaps. With the present invention one can ingest a single part, or multiple, with any ranges, still allowing the parallelism, but not requiring so many parts for small, irregular, out of order, or overlapping write patterns. This flexibility derives from the ability to selectively insert and overwrite at any location within the logical object. The merge operation also provides this functionality. The merge allows the client application to specify physical ranges within the part, along with one or more logical ranges in the resulting stream to which they can map.

Further, the present invention provides a novel mechanism that is both flexible and efficient to allow modification of an erasure-coded object without requiring data to be copied, even when new data is inserted or overwritten at any point or at multiple points within the object. It also allows efficient representation of "sparse" objects (that is, those for which part of the content has not yet been defined), and those with repetitive data (specifically, a sequence of identical bytes).

The present invention also expands the capability of an erasure-coded manifest in a variety of ways. For example, the segments that comprise a local range can appear multiple times in the sequence of erasure sets (that is, the data is repeated more than once in the logical object) without the actual data being duplicated. And, a subset ("range") of the content of an erasure set can be included in the logical object. Further, It is not required that all erasure sets incorporated in an object use the same encoding. Since the encoding is specified in the EC manifest for each erasure set, it is possible for each erasure set to use a distinct encoding.

Further, a manifest can indicate one or more portions of the logical object for which no data has been provided, and for which a "fill" pattern is specified. Thus, if that section of the logical object is accessed, the data will appear to consist entirely of multiple instances of that fill pattern.

In addition, portion of data can be inserted at any point inside the object by inserting a reference to one or more segment sets containing that data into the manifest. If the desired insertion point is within an existing segment set, then that manifest set can be "split" by incorporating two references to it, with the first specifying the range of data before the insertion point, and the second specifying the range of data after the insertion point. If there are gaps in the logical data written by the user, null bytes (or optionally a fill pattern) are returned, to facilitate reading back a partially specified object. Erasure sets referred to by a manifest need not use the same encoding. Each set can be encoded differently. In fact, sets need not even be erasure coded, meaning that the physical bytes that make up the content of the erasure set may come from a replicated stream.

Many operations are thus enabled on an erasure-coded object in Object Storage such as "append", "insert," "overwrite" and "merge" as described below.

BRIEF DESCRIPTION OF THE DRAWINGS

The invention, together with further advantages thereof, may best be understood by reference to the following description taken in conjunction with the accompanying drawings in which:

FIG. 3 presents an example manifest that may be used in embodiments of the invention.

FIG. 7 shows the newly created EC manifest.

FIG. 10 illustrates in more detail the new EC manifest after the insert operation.

FIG. 13 illustrates in more detail the new EC manifest after the overwrite operation.

FIG. 16 illustrates in more detail the new EC manifest after the merge operation.

FIG. 17 is an example EC manifest of a sparse object.

FIG. 19 shows a temporary part order manifest.

FIG. 20 shows a final completion manifest using a suitable programming language.

DETAILED DESCRIPTION OF THE INVENTION

Figure 1:
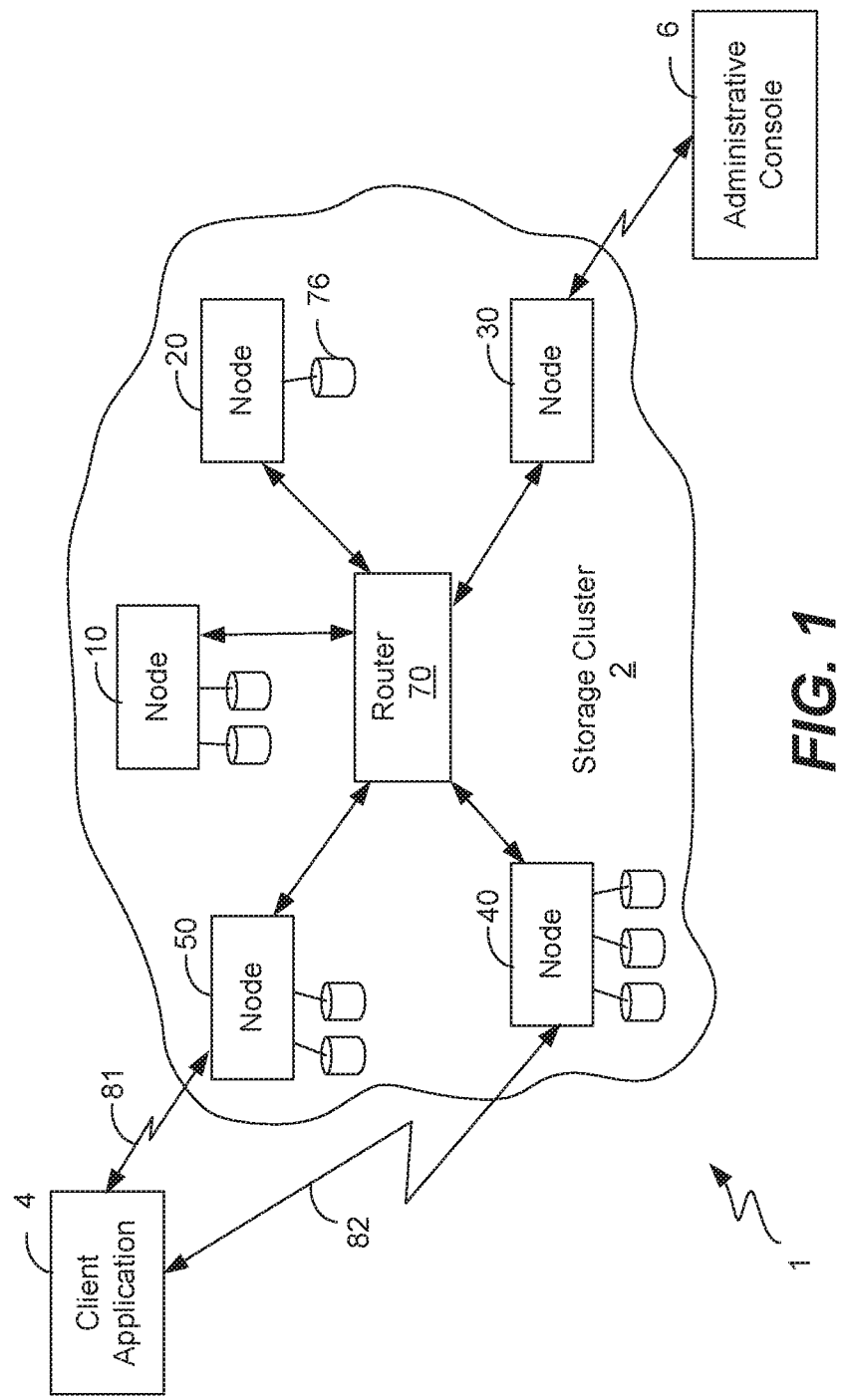
FIG. 1 illustrates an environment for operation of the present invention.

As is known in the art, erasure coding is a technique for providing redundancy of a data object without the overhead of replication. Given a particular data object, erasure coding breaks the object into K data segments and from those data segments generates P parity segments, for a total of M segments in an erasure set, commonly indicated as a K:M erasure code. For example, a data object broken into 5 segments which are then used to generate 2 parity segments is referred to as using a 5:7 erasure code. A key property of erasure codes is that the original object can be reconstructed from any K segments, whether a segment of an erasure-coded object is an original data segment or one of the parity segments. Accordingly, it is advantageous to distribute each segment to different volumes within a storage cluster (and to different nodes), thus protecting the data object against the loss of any two volumes within the cluster. Given adequate nodes in the cluster, segments are distributed to different nodes, providing protection against node loss. If nodes are located in different geographic regions, segments are distributed evenly among the regions to protect, to the extent possible, against loss of the portion of a cluster in one geographic locale. Also, different objects may be assigned different erasure codings. In the case of very large objects, several such erasure sets may be used to represent the object.

In order to address the problem of trying to identify and find segments of an object under erasure coding, instead of using a separate database, a manifest file (or object) includes a description of each segment associated with a particular object. Included within the manifest are the unique identifier within the cluster for each segment, the size of each segment, which encoding algorithm is used and the specific erasure coding (5:7, etc.) for the object. The manifest is then treated as an ordinary object within the cluster, provided with a unique identifier, and replicated as required (e.g., replicated to the same degree of redundancy, P+1). Replication of the manifest is simple because the cluster is already performing replication for other objects and has little storage overhead because the manifest is relatively small in size. Thus, the segments of a particular erasure-coded object are quickly and easily accessible via the manifest. The identifier for this manifest object is returned to client applications for future retrieval of the object. This provides the efficient footprint of erasure coding, while preserving the simple identification, high availability, and fast startup of ordinary replication.

Storage Cluster Example

As mentioned above, the present invention applies to digital objects, i.e., any type of information represented in digital form. For instance, a digital object may be an electronic representation of information such as a computer file, a group of files, a group of file identifiers, or the collections of data or database information. Such other collections of data include frames or clips from digital audio or video streams, digital photographs, scanned paper documents, voice messages, CAD/CAM designs, MRI or X-ray data, streams from message records or files, log entries from audits or status logs of systems, e-mail archives, check images, etc. The term "computer file" is often used herein to encompass any electronic representation of information.

The present invention may be implemented using any suitable computer hardware and software, and may be implemented upon a storage cluster that includes any number of computer nodes. Preferably, each node includes a CPU (or multiple CPUs), an operating system, communication links to the other nodes (or, to at least a central router), and any number of internal hard disk drives or solid-state drives (i.e., from zero to N), often referred to as volumes. Typically, each node includes at least one drive and there may be any combination of hard disk drives along with solid-state drives. A storage cluster is typically a fixed-content cluster, meaning that it is used for backups, long-term storage, archiving, etc., and is not typically used for day-to-day access to computer files. Often referred to as WORM (write once, read many) storage, this means that once a computer file or digital object is written to the cluster it cannot be changed. (Of course, the file may be deleted and a modified version of the computer file may also be stored within the cluster.) A cluster may be implemented as a redundant array of independent nodes (a RAIN) meaning that each node runs its own operating system and makes independent decisions about storage within the cluster. Storage clusters may be built upon blades, towers, personal computers and servers. Alternatively, a multi-core processor within a single computer box may support a virtual storage node running on each core, meaning that a storage cluster having multiple nodes may be present within the single computer box. Further, a computer system inside a single physical box may include multiple CPUs in which case each CPU may represent a node and the storage cluster may be implemented within the single physical box.

FIG. 1 illustrates an environment 100 for operation of the present invention. Included is a storage cluster 120, a client application 130, an administrative console 140, any number of computer nodes 10-50, and a central router 170. As mentioned above, a computer node is typically a physical file server that preferably includes at least one CPU and any number of disk drives 160, solid-state drives or hybrid drives that have both types. In one particular embodiment, the storage cluster 120 may be further logically or physically divided into sub clusters. For example, nodes 40 and 50 may be considered one subcluster, while nodes 10, 20 and 30 may be considered a second subcluster. Division of a cluster into sub-clusters may be advantageous where one subcluster is located in a different geographic location from another subcluster.

Each node implements an operating system such as Debian Linux and executes processes to manage peer-to-peer communications between nodes, to perform health processing, and to make independent decisions on behalf of the node and its volumes. Each node also includes administrative software and its status can be viewed via a web browser over the Internet. In one particular RAIN embodiment, each node is a 1U server (e.g., an x86 computer) with 1 terabyte or more of serial ATA disk storage capacity with standard Ethernet networking. Each node has an IP address and may be physically interconnected using an IP-based LAN, MAN or WAN. Thus, each node may talk to a single node or may broadcast a message to all nodes within the storage cluster (a multicast) using a router 170 or other similar network switch.

Each node includes a management module for handling external requests from client applications (e.g., an SCSP request from client 130), replication requests between nodes (e.g., interSCSP requests), and other internode protocol communications (bidding, requests for information, etc.). A health processing module manages the digital content of each node. The administrative console 140 is preferably a Web server linked to the storage cluster that allows access to each node over any suitable Internet connection. Each node implements a redundant administrative console which can be used to view and administer the entire cluster. In certain embodiments, all nodes are considered equal and communicate with each other by periodically broadcasting (or "multicasting") their relevant information to all other nodes within the cluster.

In one embodiment, a storage cluster may be implemented using content storage software available from Caringo, Inc. of Austin, Tex. (as modified as described herein), and any suitable computer hardware. In this embodiment, a storage cluster implements fixed-content content-addressable storage and each digital object is uniquely addressed within the cluster by a random number (a universally unique identifier, or UUID) that has been generated for that digital object using a random number generator. The contents of each digital object may be verified using a hash function. A client software application receives the UUID when storing a digital object in the cluster and retrieves that digital object by supplying the UUID to the cluster. Software applications communicate with a CAStor cluster using standard HTTP 1.1, and more specifically, using a simplified subset of the standard called Simple Content Storage Protocol (SCSP). Using this standard interface, client applications such as electronic mail, enterprise content management, health care applications, Web browsers, Web 2.0 sites, photo sharing, social media sites, security video, video editing, etc., may access the CAStor storage cluster in order to store files, retrieve files or delete files. Further, direct HTPP access is available for browsers, JAVA, Python, C++, and other software environments.

In one embodiment, a digital object is stored on a particular node in the following way. Each node includes a disk index in RAM listing where a digital stream including the object is stored on disk based upon its unique identifier. For example, a first column of the index lists the unique identifier of the object, a second column lists at which sector the stream starts and a third column lists either the length of the stream or the sector in which it ends. A stream may include the digital object as well as relevant metadata. Accordingly, objects to be stored on a node may simply be written sequentially to the disk and their locations recorded in the RAM index. Or, objects may be stored anywhere on the disk using any suitable storage algorithm and the objects' locations again will be recorded in the index. When an object is to be read or deleted, its location on the disk may be found by consulting this index. To facilitate building up this RAM index upon a restart of the node, a journal of the node stored within persistent storage records whenever an object is added or deleted and includes the unique identifier for the object, the sector at which it starts, its length in sectors or bytes, and other information as described below. Accordingly, when the node is restarted the information in the journal is read and is used to create the disk index in RAM. Another technique to build up the index instead of using a journal is to read the entire disk upon a restart in order to gather the necessary information although this will be more time consuming.

Erasure Set Example

Figure 2:
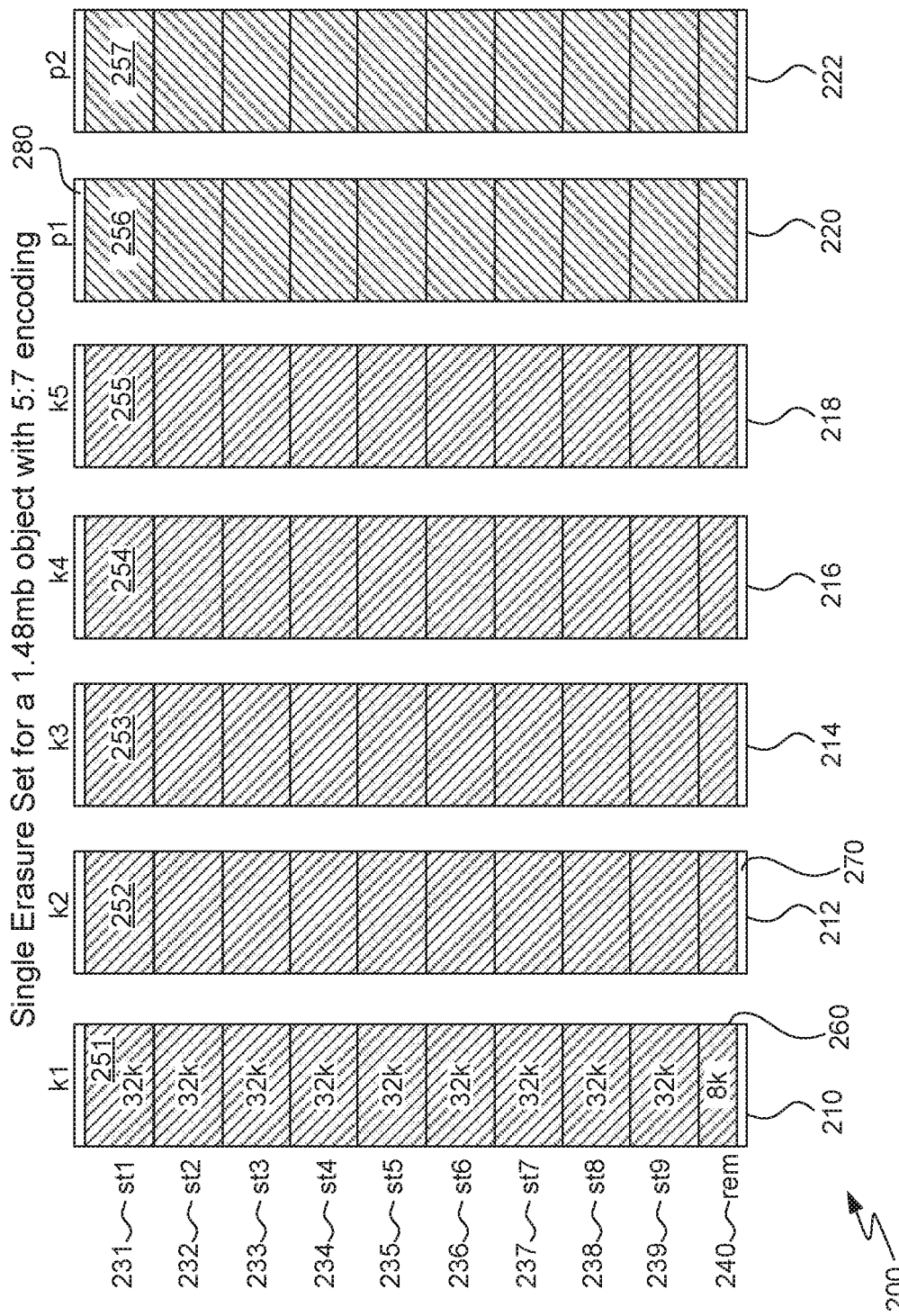
FIG. 2 illustrates an example erasure set for an object using 5:7 erasure coding.

FIG. 2 illustrates an example erasure set 200 for an object using 5:7 erasure coding. As shown, the data of the original object is separated into five data segments (k1-k5) 210-218, from which are generated two parity segments (p1 and p2) 220 and 222. In one embodiment, the data is written, and the parity is generated, in stripes (st1-st9) 231-239. For example, the first stripe 231 consists of original data 251-255 from which are generated parity data 256 and 257. Any remaining data is formed in a final remainder stripe (rem) 240 and hash metadata may be stored at the end of each segment in a section 270.

As mentioned earlier, an object (or stream) to be stored within the cluster may be broken into several erasure sets of a given size, the size being chosen for performance sake. A very large object may be broken into several erasure sets, for example. Within an erasure set the K data segments and the P parity segments are written using stripes with a fixed-size block of data written successively into each of the K data segments and then generating and writing the parity blocks to each of the P parity segments, each stripe (across the K+P segments) serving as an erasure coding unit. The last stripe in a segment (remainder stripe 240, e.g.) may have a smaller block size that can be readily computed. Stripes are typically written until the incoming data is exhausted or until the given size for the erasure set has been filled, with subsequent data starting a new erasure set.

In a specific embodiment, data from a single write operation is written in stripes across all K segments of the erasure set in fixed-size blocks (e.g., 32k bytes). In other words, blocks 1, K+1, 2K+1, etc., are written to the first segment 210, blocks 2, K+2, 2K+2, etc., are written to the second segment 212, etc. The P parity blocks are generated synchronously as part of the generation of each stripe of data and are incrementally written at the end of each stripe. Striping allows parity segments to be generated synchronously with predictable memory overhead and also allows the writing of chunked-encoded streams, which usually do not provide the content length at the beginning of the write operation. Of course, the original data object need not be divided up into stripes in order to perform the erasure coding, but this provides some efficiency as the parity segments can be generated for each stripe and then move on to the next stripe. Alternatively, if striping is not used, the first data segment 210 would include the first blocks of data within the data object, the second data segment 212 would include the next set of blocks of data, and so forth. At the end of each segment in the set is metadata 270 for each segment which includes an MD5 hash value for that segment. For example, each hash value is 16 bytes and written without separators.

Each segment of an erasure set is an immutable stream, each having its own unique identifier, just as with any other stream of the cluster. Each erasure segment also contains an additional header 280 containing metadata concerning the other segments in the erasure set, such as the unique identifier of its manifest, and the unique identifiers of all of the data and parity segments, in order. Each segment's own unique identifier will identify its place in its set of siblings. The header for each segment will also include system metadata such as the volume identifier where the segment is located, and the likely volume identifier for the next segment of the erasure set (the volume hint). For example, segment k4 includes the volume identifier where the segment k5 is located, segment p2 includes the volume identifier were the segment k1 is located, etc. Preferably, each erasure set being part of a larger stream (representing a single object) will have the same erasure coding, e.g., 5:7 for all erasure sets.

During a write operation, each of the seven segments shown may be written in parallel using seven different nodes of the cluster, thus providing for data protection should a node or volume fail. Once a segment is written to a volume, it may be treated like any other stream within the cluster (aside from the volume and its contents, its recovery process, and the fact that it need not be replicated).

Manifest Example

FIG. 3 presents an example manifest 300 that may be used in embodiments of the invention. As mentioned earlier, once erasure coding has been used to encode a data object into any number of segments (depending upon the encoding used), the unique identifiers for those segments may be stored within a manifest (it itself being an object stored within the cluster and having its own unique identifier) for later retrieval.

Included within each manifest is a metadata section 310, at least one erasure set 340 and any number of other erasure sets 380. Of course, the number of erasure sets represented within the manifest depends upon the size of the data object, the size of each segment, and the encoding scheme used. Section 312 of the manifest provides the name of the erasure coding algorithm used and its version number. The specific erasure coding is shown in section 314 and the size of each data block (stripe width) within a segment is shown in section 316. Other information in this metadata section includes the time the object was written, its unique identifier, its ownership, and metadata specified by the application.

The representation of the first erasure set (or the only erasure set) includes its size 342, the erasure coding used for this erasure set 344, the segment width 346 (in bytes), and the total segment size 348 (in bytes). Information such as the encoding and segment width may also be present within each erasure set as well as in metadata section 310 in order to provide flexibility, or such data may only be present in one area.

The first erasure set also includes the unique identifiers for each of the segments in that erasure set. For example, section 350 shows unique identifiers for the segments in the first erasure set. As mentioned, the manifest may contain one or more erasure set. In that situation, representation of a second erasure set 380 may be included as well as any number of other representations of other erasure sets. The second erasure set shows the size (that may be different from the first set), an encoding, and similar information as the first erasure set. The second erasure set may use the same encoding as the first set, as well as segment width and segment size, but this is not a general requirement.

Any additional erasure sets will include the unique identifiers for all segments included within that erasure set. Preferably, manifests themselves are replicated and not erasure coded. This will not hurt space efficiency because a manifest only uses a small fraction of the space of the data object for which it is a manifest. In addition, in order to offer the same protection against simultaneous disk failures as the erasure encoding of the erasure sets, the manifest for a data object encoded using K:M (P=M−K) encoding should have a total number of replications of at least P+1.

Further, the data specified by an erasure set in the manifest may be contained in a physical erasure set (which is a made up of a number of segments) on disk as described above, or is generated on demand when a READ is performed. Generation on demand is performed by returning a specified "fill" byte (e.g., a fill character such as a "0" or any letter) for as many bytes as are specified by the size of the set. So, the logical bytes of the erasure set are the bytes as they exist in the final stream, and are returned either from reading physical bytes on disk, or by using the fill character to dynamically generate data on a READ request.

Simple Erasure Set, Logical Object and Manifest Example

Figure 4:
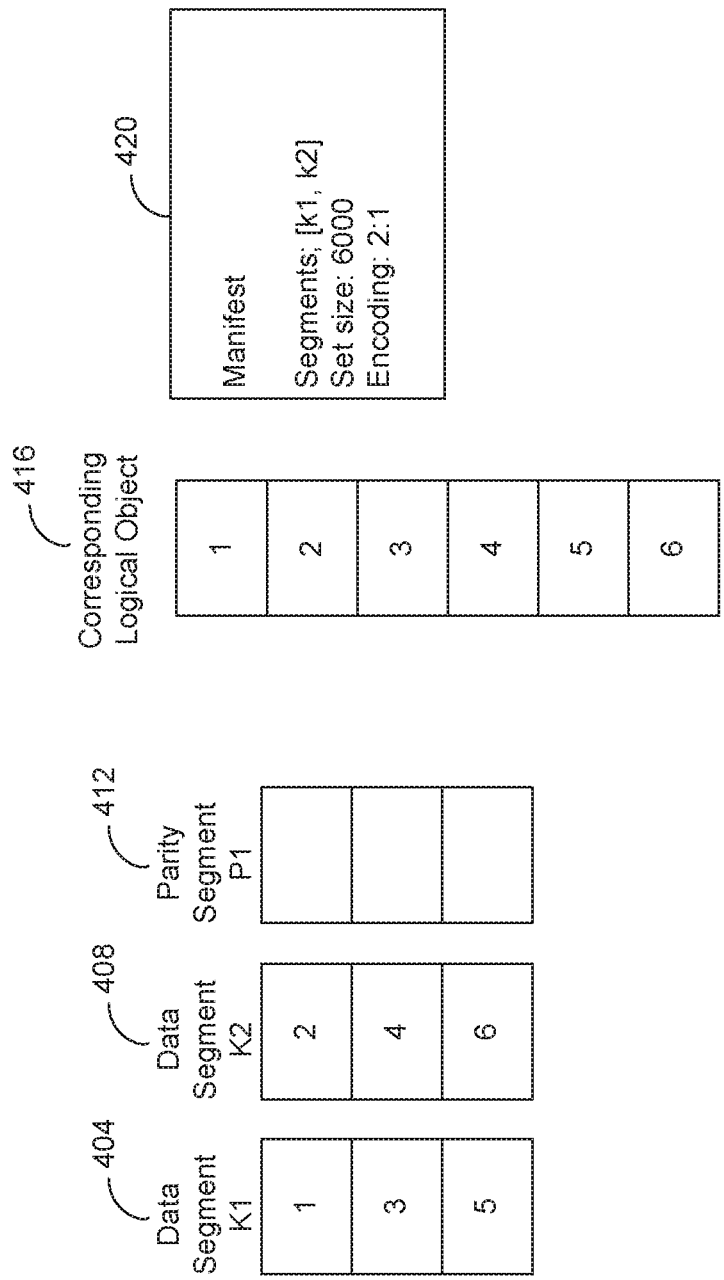
FIG. 4 is an example of a single erasure set with a 2:3 encoding.

FIG. 4 is an example of a single erasure set with a 2:3 encoding meaning two data segments plus one parity segment. Shown are data segments 404, 408 and parity segment 412. The corresponding logical object is shown at 416 and a symbolic erasure coding (EC) manifest is shown as 420. For example, a segment width of 1,000 bytes may be utilized. Thus, the first 1,000 bytes of data are written to data segment K1 as 1, the next 1,000 bytes to K2 as 2, then the next 1,000 bytes to K1 as 3, etc. Note that while this example shows a (K:M) 2:3 encoding for simplicity, the invention is applicable to any encoding (3:5, 6:15, etc.). Also, the invention is applicable when a segment width is not employed, meaning at data segments may not contain "stripes" (e.g., the logical object in this case would contain only 1 and 2, not 3 through 6).

An object can be made up of several such erasure sets (each with a different encoding, if desirable), should it be too large to be contained in a single erasure set. The manifest describes how the logical object is constructed from the erasure sets it identifies the segments, as well as the size and encoding for each set, as well as the order of the erasure sets in the makeup of the logical object.

Append Operation Example

Should a client application wish to append data at the end of an original object stored in Object Storage, first, enumerable erasure sets (or a set) are created to contain the data for the append data (including computing parity segments as needed), then references to the newly created erasure set (or sets) are appended to the erasure-coding (EC) manifest for the original object. No existing data is moved or copied in the process. Appending data to an original object requires creating a physical set of erasure-coded segments, and then appending their description as an erasure set to the end of the existing EC manifest, so that none of the existing physical erasure sets are modified; only the object containing the logical erasure set descriptions, the EC manifest, is modified.

Figure 5:
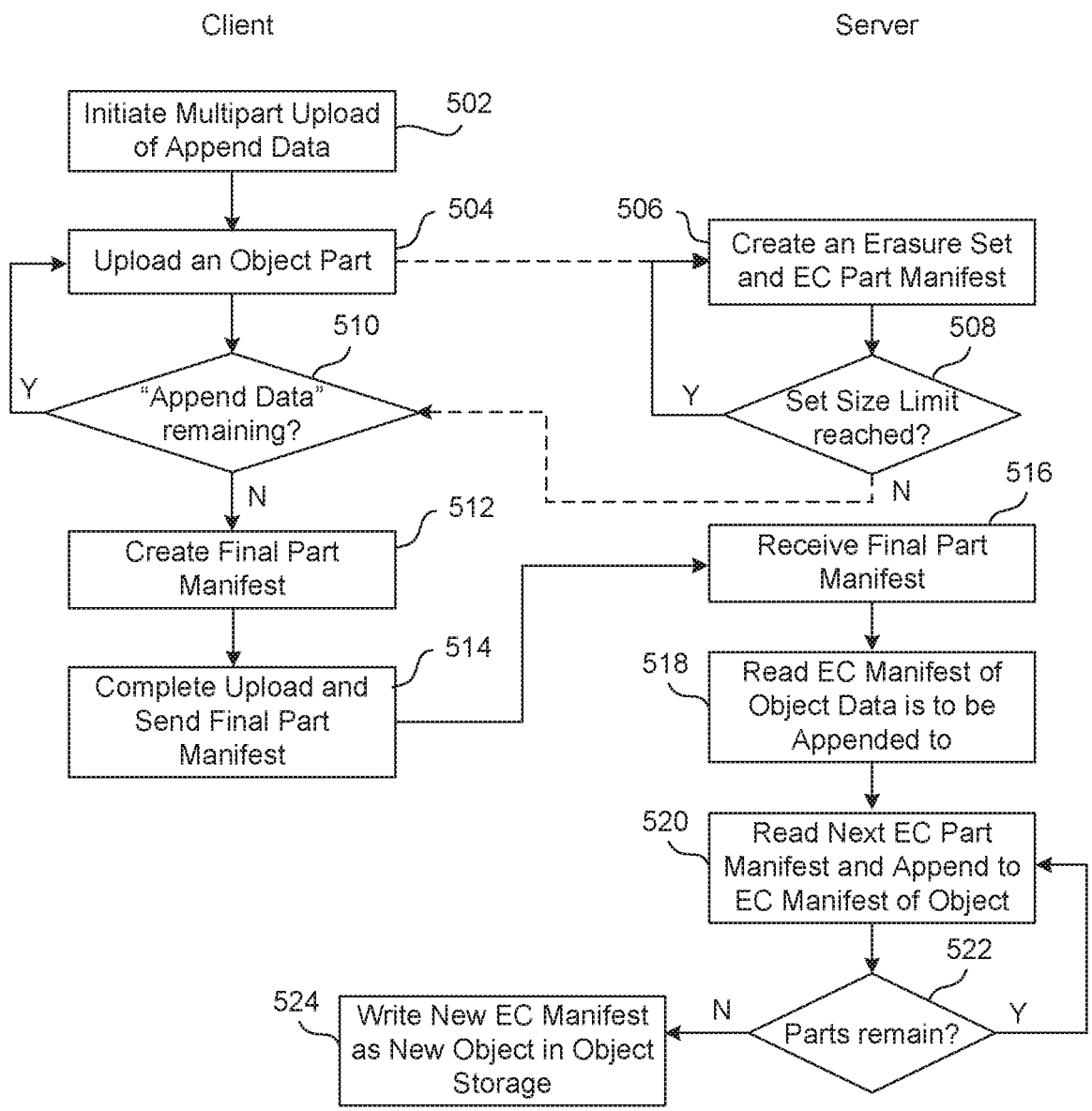
FIG. 5 is a flow diagram describing one embodiment of the append operation.
Figure 6:
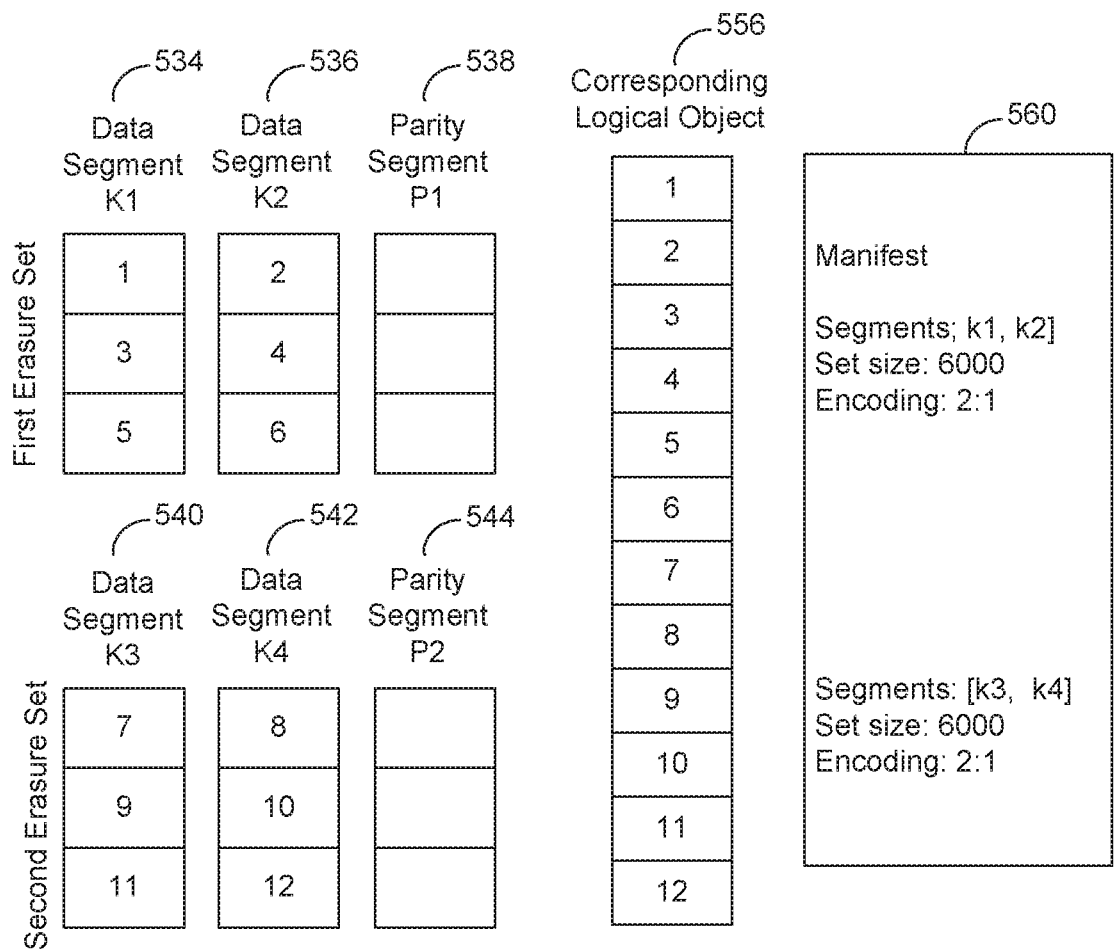
FIG. 6 is a block diagram showing symbolically the erasure sets, logical object and EC manifest after the append operation.

FIG. 5 is a flow diagram describing one embodiment of the append operation. FIG. 6 is a block diagram showing symbolically the erasure sets, logical object and EC manifest after the append operation. FIG. 7 illustrates in more detail the EC manifest after the append operation. These figures will be referred to in the below discussion of the append operation.

In a first step 502 a client application initiates with a computer server a multi-part upload of append data to be appended to the end of a digital object that has previously been stored using erasure coding in Object Storage. FIG. 1 shows such a client application 4, a suitable computer server executing upon node 20 (for example), and Object Storage located within persistent storage 76. Typically, whichever software is connected to the computer server is the "client application." The client may be one link of many in a chain of processes, but ultimately, content is sent to the computer server via a TCP socket connection (for example) and that content will be stored on disk as a stream, either as is via a replicated stream, or erasure coded, along with a manifest as an EC stream. The source of that content could be varied, whether a file in a file system, streaming data from an arbitrary source, or even manually-typed characters. The content is simply a byte stream to the computer server. In this example the existing object is stored using a first erasure set 534-538, and includes data portions 1-6 shown at 556. The existing EC manifest (also stored within Object Storage) for this existing object is represented by 570-589 of FIG. 7.

The present invention allows the append data to be uploaded to Object Storage in any number of object parts, in any order, either serially or in parallel, and includes situations in which not all object parts of the append data are available at the client application (in which case the missing object parts are retrieved from Object Storage before appending). Further details on multi-part uploading of objects, the temporary part order manifest and the final part order manifest are described below with reference to FIGS. 18-20, which describe a specific embodiment for uploading data.

In step 504 the client application uploads the first portion of the append data as the first object part to Object Storage and begins creation of the temporary part order manifest 980. This object part may be any of the parts (i.e., rows) shown in manifest 980. In response to the upload the Object Store will create a unique identifier (such as a globally unique identifier) for the EC part manifest and returns it to the client application for placement into the temporary manifest.

In step 506 the server encodes the object part using erasure coding, creates an erasure set and an erasure-coding (EC) part manifest for that erasure set. In step 508 if it is determined that the erasure set size limit has been reached (i.e., the object part will not fit into one erasure set) then control returns to step 506 in which another erasure set is created for the remaining data in the object part, and the EC part manifest is updated. The loop between steps 506 and 508 continues until all data in the object part has been encoded. Of course, if only one erasure set is needed then the resulting EC part manifest may appear as shown in the example of FIG. 3 in which only one erasure set is used. If more than one erasure set is needed, then the resulting EC part manifest appears as shown in FIG. 3 except that metadata describing each additional erasure set (similar to metadata 340) is added to the manifest.

A preferred implementation requires that object parts are erasure coded, however, the general concept of a manifest (mapping physical to logical bytes) does not require it, so, as mentioned earlier, an erasure set may also point to a replicated stream as an erasure stream. Thus, an object part may also be a replicated stream, stored as an object with a unique identifier in the Object Storage.

If, in step 508 the erasure set size limit has not been reached, this implies that the newly created EC part manifest now includes the entire object part and a unique identifier representing this EC part manifest is returned to the client application for insertion into the temporary part order manifest in order to represent the newly uploaded object part. Then control returns to step 510.

In step 510 it is determined whether there is additional append data remaining that was not included in the previous object part or in parts that have already been uploaded in a previous step 504. If so, then another object part of the append data is uploaded as described above in steps 504-508. Each object part that is uploaded will have its own EC part manifest, such as the manifest shown in FIG. 3. If no more append data is remaining in step 510, then control moves to step 512. During these previous steps the client application (or coupling server 920, if used) continues to update the temporary part order manifest 980, keeping track of all unique identifiers that identify all of the EC part manifests that have been created for the object parts that have been uploaded. If not all object parts are present in this temporary manifest at the completion of step 510, these are deemed to be missing object parts and will be filled in as described below.

In this simple example it is assumed that the append data consists of only a single object part and that this single object part can be represented by a single erasure set. This append data consists of data portions 7-12 as shown at 556 (shown once the append operation has completed) and a symbolic representation of its erasure set is shown at 540-544. Accordingly, the temporary part order manifest 980 for the append data will include only a single part, whose unique identifier identifies the EC part manifest created for that part in step 506.

In step 512 the client application (or coupling server) creates the final part order manifest 990 using the temporary part order manifest. In situations where there are no missing object parts in the temporary manifest the final part order manifest can be created directly from the temporary manifest. If there are missing object parts, then the client application retrieves identifying information for these missing object parts from the Object Storage (as described below in the discussion of the Multi-Part Upload System) and creates the final manifest 990.

In step 514 the upload is completed and the final part order manifest is sent to the server. The final manifest now includes a list of all object parts that comprise the append data in the correct order. In step 516 the server receives the final part order manifest from the client application. Next, in step 518 in order to append the append data (represented by the final part order manifest) to an original object in Object Storage, the server obtains a unique identifier representing the EC manifest of this original object. Preferably, the client application tells the server to which original object the append data should be appended (i.e., which unique identifier) by specifying the original object in the URI of the request.

This unique identifier identifies the EC manifest of the original object which may appear, for example, as shown in FIG. 3. Of course, this EC manifest may include any number of erasure sets each having different a different size, encoding, width, etc.

Next, in step 520 the server uses the final part manifest in order to obtain the first (or next) EC part manifest that represents the first (or next) object part to be appended to the original object in Object Storage. By way of example, an object part uploaded in step 504 resulted in an erasure set (or sets) being created for that object part and an EC part manifest was created representing that object part. A unique identifier for each EC part manifest is now stored in the final part manifest 990. Thus, the first (or next) EC part manifest is obtained by reading the first (or next) unique identifier for an object part from the final part manifest. By way of example, unique identifier 994 represents the first object part to be appended to the original object. Once that unique identifier is read, the EC part manifest is obtained from Object Storage and its erasure set metadata is appended to the EC manifest of the original object. By way of example, FIG. 7 shows the EC manifest of the object after this append of step 520. The EC manifest of the original object includes only erasure set metadata 580 (in this example). The erasure set metadata 590 of the first object part to be appended has been added to that EC manifest. Of course, if the first object part to be appended includes more than one erasure set then these erasure sets would also be appended to the EC manifest in order. Note that the original erasure set metadata 580 of the EC manifest does not change.

Next, in step 522 it is determined whether the final part manifest representing the append includes other parts (e.g., final part manifest 990 includes a total of 13 parts). If so, then control returns to step 520 in order to read the next EC part manifest and append its erasure set metadata to the end of the current EC manifest of the original object. Accordingly, the EC manifest of FIG. 7 may grow to include any number of erasure set metadata representing all of the append data. Once no parts remain then control moves to step 524.

At this point, the new EC manifest that has been created in step 520 represents not only the original object but all append data that has been added to the end of that object. In step 524 this newly created EC manifest is written as a new object into Object Storage (i.e., onto disk of one of the computer nodes of FIG. 1); a unique identifier is created for this new EC manifest and this identifier is returned to the client application so that the client application now has a unique identifier representing the original object to which the append data has been appended. Preferably, updates such as this append operation are made by creating a new stream (new EC manifest), and then referring to the new stream instead of the old when serving requests for that resource.

In this simple example, FIG. 7 shows the newly created EC manifest in which erasure set metadata 580 represents the original object and erasure set metadata 590 represents all of the append data. FIG. 6 shows the newly created logical object 556 that includes data portions 1-6 of the original object and data portions 7-12 of the append data.

Insert Operation Example

Should a client application wish to insert data into an original object stored in Object Storage, first, enumerable erasure sets (or a set) are created to contain the data for the insert data (including computing parity segments as needed), then references to the newly created erasure set (or sets) are inserted into the erasure-coding (EC) manifest for the original object. No existing data is moved or copied in the process.

If the desired insertion point is within an existing erasure set, then that set is "split" by incorporating two references to that set into the manifest, with the first reference specifying the range of data before the insertion point, and the second reference specifying the range of data after the insertion point. Once this "split" has been accomplished, the reference to the erasure set (or sets) containing the inserted data is inserted into the manifest between the references to the two "split" sets. This technique can be generalized to multiple insertions of insert data. None of the existing physical erasure sets are modified; only the object containing the logical erasure set descriptions, the EC manifest, is modified, or, a new EC manifest is created.

Figure 8:
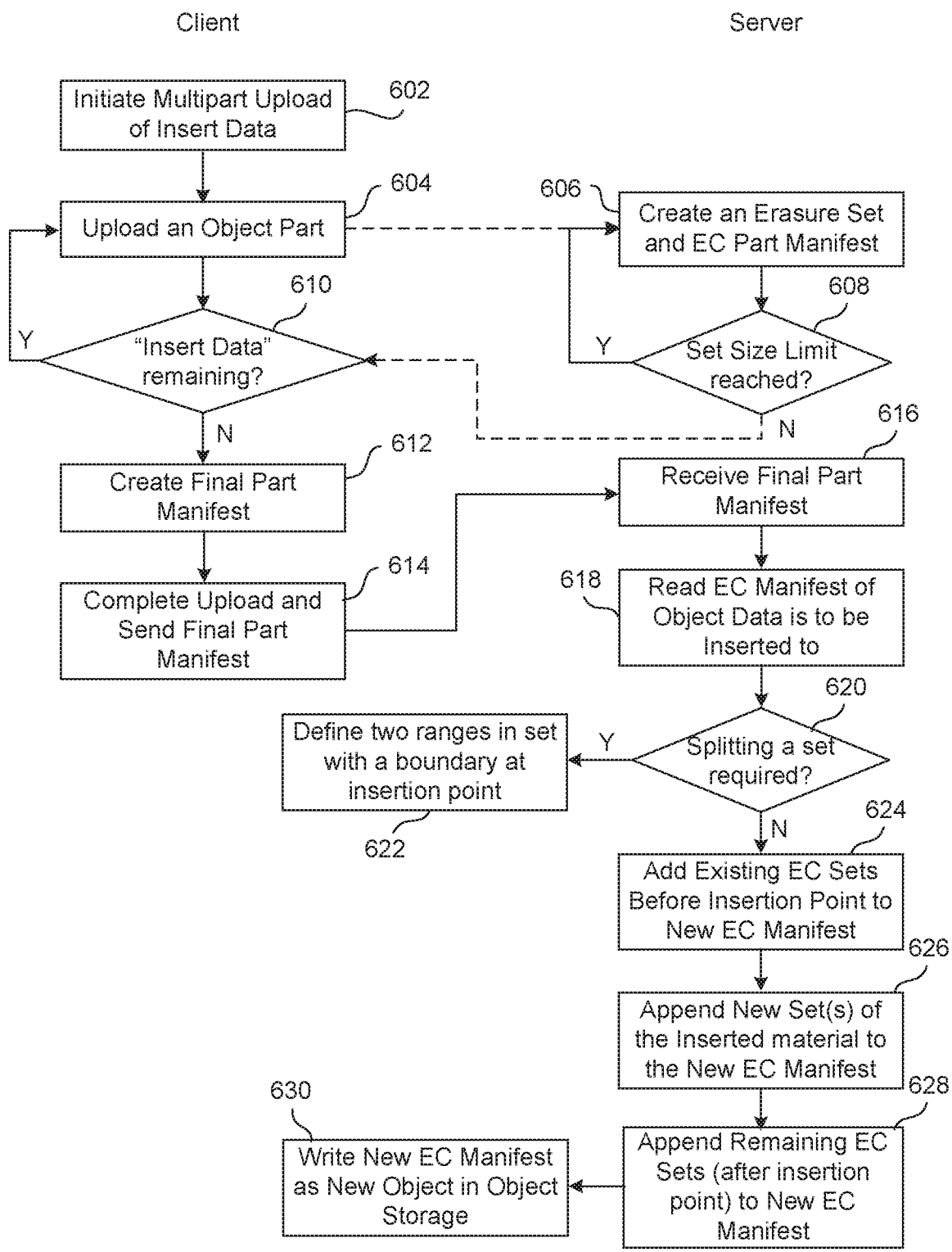
FIG. 8 is a flow diagram describing one embodiment of the insert operation.
Figure 9:
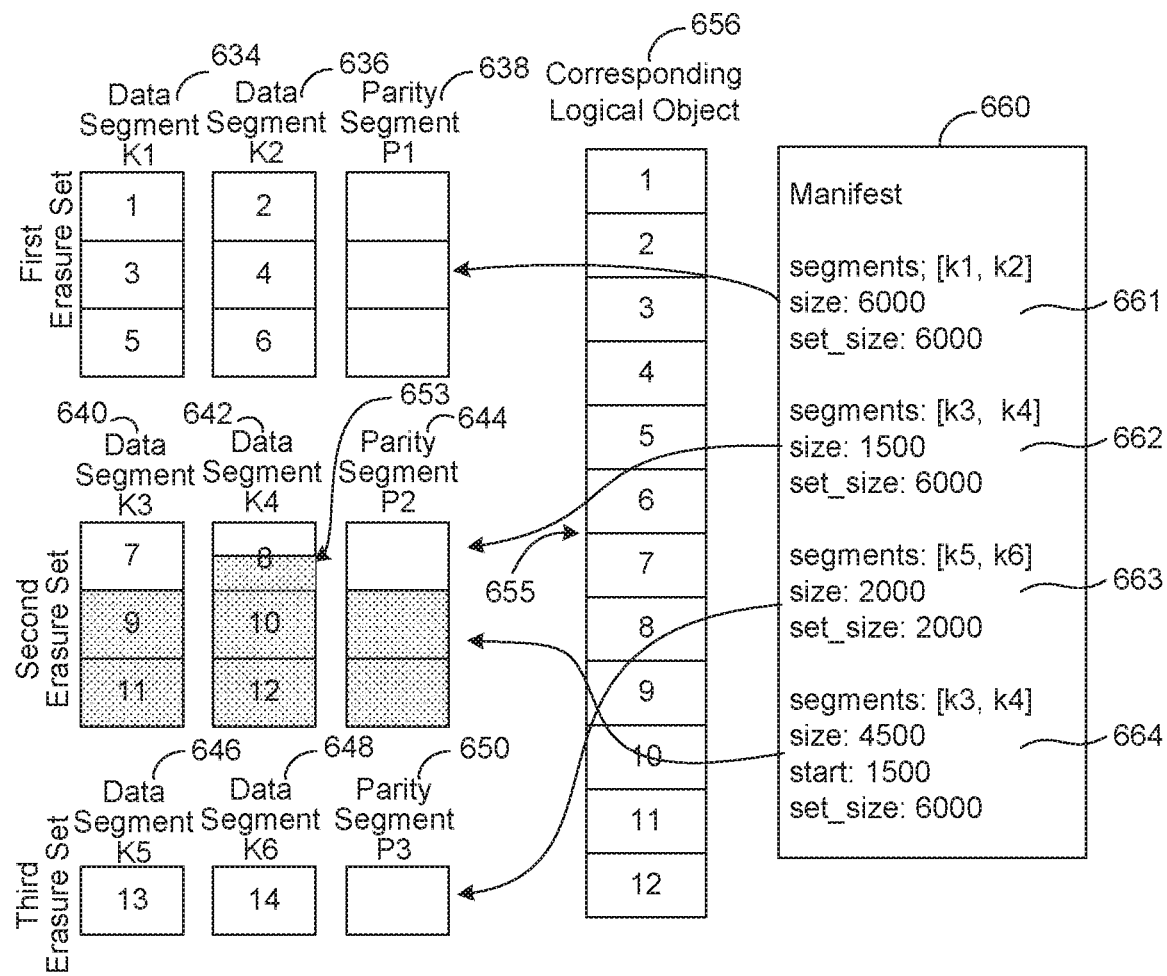
FIG. 9 is a block diagram showing symbolically the erasure sets, logical object and EC manifest after the insert operation.

FIG. 8 is a flow diagram describing one embodiment of the insert operation. FIG. 9 is a block diagram showing symbolically the erasure sets, logical object and EC manifest after the insert operation. FIG. 10 illustrates in more detail the new EC manifest after the insert operation. These figures will be referred to in the below discussion of the append operation.

Consider the example of FIG. 7 in which an existing object in Object Storage includes two erasure sets as shown, and it is desired to insert insert data. Should the client application wish to insert data in the logical object at a point 653 of FIG. 9 (which corresponds to the middle of portion 8 in segment K4), first, the reference to the second erasure set 640-644 is duplicated in the manifest so that erasure set metadata 662 is duplicated as metadata 664. Then, references to the starting and finishing points of the data in that erasure set are adjusted so that a split appears at the point corresponding to the desired insertion. Now, the bytes to be inserted are written into one or more erasure sets (in this example these are segments 646, 648, 650, corresponding to portions 13 and 14), and a reference to this new erasure set 663 is inserted into the manifest at the split location. After this is done, if the logical stream is read, the inserted bytes will appear in the proper location.

In a first step 602 a client application initiates with a computer server a multi-part upload of insert data to be inserted into a digital object that has previously been stored using erasure coding in Object Storage such as shown in FIG. 1. Typically, whichever software is connected to the computer server is the "client application." The client may be one link of many in a chain of processes, but ultimately, content is sent to the computer server via a TCP socket connection (for example) and that content will be stored on disk as a stream, either as is via a replicated stream, or erasure coded, along with a manifest as an EC stream. In this example the existing object is stored using first and second erasure sets 634-638, 640-644 and includes data portions 1-12 of FIG. 9 (shown at 656 after insertion). The existing EC manifest (also stored within Object Storage) for this existing object is represented by FIG. 7.

The present invention allows the insert data to be uploaded to Object Storage in any number of object parts, in any order, either serially or in parallel, and includes situations in which not all object parts of the insert data are available at the client application (in which case the missing object parts are retrieved from Object Storage before inserting). Further details on multi-part uploading of objects, the temporary part order manifest and the final part order manifest are described below with reference to FIGS. 18-20.

In step 604 the client application uploads the first portion of the insert data as the first object part to Object Storage and begins creation of the temporary part order manifest 980. This object part may be any of the parts (i.e., rows) shown in manifest 980. In response to the upload the Object Store will create a unique identifier (such as a globally unique identifier) for the EC part manifest and returns it to the client application for placement into the temporary manifest.

In step 606 the server encodes the object part using erasure coding, creates an erasure set and an erasure-coding (EC) part manifest for that erasure set. In step 608 if it is determined that the erasure set size limit has been reached (i.e., the object part will not fit into one erasure set) then control returns to step 606 in which another erasure set is created for the remaining data in the object part, and the EC part manifest is updated. The loop between steps 606 and 608 continues until all data in the object part has been encoded. Of course, if only one erasure set is needed then the resulting EC part manifest may appear as shown in the example of FIG. 3 in which only one erasure set is used. If more than one erasure set is needed, then the resulting EC part manifest will have additional erasure sets added.

If, in step 608 the erasure set size limit has not been reached, this implies that the newly created EC part manifest now includes the entire object part and a unique identifier representing this EC part manifest is returned to the client application for placement into the temporary part order manifest in order to represent the newly uploaded object part. Then control returns to step 610.

In step 610 it is determined whether there is additional insert data remaining that was not included in the previous object part or in parts that have already been uploaded in a previous step 604. If so, then another object part of the insert data is uploaded as described above in steps 604-608. Each object part that is uploaded will have its own EC part manifest, such as the manifest shown in FIG. 3. If no more insert data is remaining in step 610, then control moves to step 612. During these previous steps the client application (or coupling server 920, if used) continues to update the temporary part order manifest 980, keeping track of all unique identifiers that identify all of the EC part manifests that have been created for the object parts that have been uploaded. If not all object parts are present in this temporary manifest at the completion of step 510, these are deemed to be missing object parts and will be filled in as described below.

In this simple example it is assumed that the insert data consists of only a single object part and that this single object part can be represented by a single erasure set. This insert data consists of data portions 13 and 14 as shown in FIG. 9 (shown in 656 once the insert operation has completed) and a symbolic representation of its erasure set is shown at 646-650. Accordingly, the temporary part order manifest 980 for the insert data will include only a single part, whose unique identifier identifies the EC part manifest created for that part in step 606.

In step 612 the client application (or coupling server) creates the final part order manifest 990 using the temporary part order manifest as described in step 512.

In step 614 the upload is completed and the final part order manifest is sent to the server. The final manifest now includes a list of all object parts that comprise the insert data in the correct order. In step 616 the server receives the final part order manifest from the client application. Next, in step 618 in order to insert the insert data (represented by the final part order manifest) into an original object in Object Storage, the server obtains a unique identifier representing the EC manifest of this original object. Preferably, the client application tells the server to which original object the insert data should be inserted (i.e., which unique identifier) by specifying the original object in the URI of the request. This unique identifier identifies the EC manifest of the original object which may appear, for example, as shown in FIG. 7. Of course, this EC manifest may include any number of erasure sets each having different a different size, encoding, width, etc.

Next, in step 620 it is determined whether the insert data is to be inserted at a point such as point 653 (which splits an existing erasure set) or at a point such as point 655 (which occurs between two erasure sets and does not split one of them). As discussed herein, the final part order manifest (e.g., as shown in FIG. 20) is essentially a map of physical bytes to logical bytes in the logical object, telling the server where to insert any number of new physical ranges into the logical stream. Fields 984 and 986 of the manifest show how the manifest may dictate where in the logical object the part or parts shall be inserted.

If splitting an erasure set is required (i.e., the insertion point is at 653) then in step 622 two ranges are defined within the second erasure set (where the insertion point is); the first range is the range of data before the insertion point and the second ranges the range of data after the insertion point. As shown in FIG. 9, insertion point 653 occurs at data byte 1500 of the second erasure set, accordingly, the first range of data is 0-1500, and the second range of data is 1501-6000. These ranges are shown symbolically in manifest 660. The second erasure set metadata 662 shows that its size is only 1500 bytes out of a total set size of 6000 bytes, and the second erasure set is duplicated in the manifest as metadata 664, showing that its size is only 4500 bytes out of a total set size of 6000 bytes. Metadata 662 has no start byte, implying that a default of starting at 0 is used. By contrast, metadata 664 has a start byte of 1500 meaning that is from where data is read. On the other hand, if splitting a set is not required (i.e., the insertion point is 655, for example), then control moves to step 624.

In step 624 the existing erasure sets of the EC manifest of the original object, up to and including an erasure set which is split by the new insert data, are added to a new EC manifest which will represent the original object with the insert data. In this example, the EC manifest of the original object is shown in FIG. 7, and FIG. 10 shows that erasure sets 580 and 590 have been added to the new EC manifest. If the insertion point is point 655 (no splitting) then only erasure set 580 is added to this new EC manifest. Note that the first range of data is defined within erasure set 590 by using a new field data size 692 which indicates that only the first 1500 bytes of this erasure set shall be read when the erasure sets are read in order.

Next, in step 626 the erasure set or sets corresponding to the insert data are appended to the current new EC manifest. As shown, this results in erasure set 680 being added as shown in FIG. 10. Erasure set 680 represents the insert data which has a size of 2000 bytes. This erasure set (or sets) is obtained by reference to the final part manifest received in step 616 and retrieving of these erasure sets may be performed as previously described in steps 520-522. As shown, the erasure set size 693 is 2000 bytes and the data size 695 that should be read from this erasure set is also 2000 bytes.

Next, in step 628 the remaining erasure sets from the original EC manifest (including any erasure set that was split or any erasure set occurring after the split) are appended to the new EC manifest. As shown in FIG. 9, metadata 662 for the second erasure set is duplicated as metadata 664 and is appended to the end of the manifest. Accordingly, as shown in FIG. 10, the second erasure set 590 has been duplicated and also appears at the end of the manifest as erasure set four 590' after erasure set 680. This is because the second erasure set had been split. If there had been other erasure sets after the split they would also be appended to the EC manifest. Note that erasure set 590' has a data size 694 of only 4500 bytes because it had been split. It also has a start field 696 indicating that data must be read starting at byte 1500. Thus, reading of the erasure set 590' must commence at byte 1500 (which is after split point 653). Note that the segments referred to by EC set four are the same as the segments referred to by EC set two. Manifest erasure set two and manifest erasure set four both refer to the same physical erasure set of segments on disk.

At this point, the new EC manifest that has been created in steps 624-628 represents not only the original object but all insert data that has been inserted into that object. In step 630 this new EC manifest is written as a new object into Object Storage (i.e., onto disk of one of the computer nodes of FIG. 1); a unique identifier is created for this new EC manifest and this identifier is returned to the client application so that the client application now has a unique identifier representing the original object into which the insert data has been inserted.

Preferably, updates such as this insert operation are made by creating a new stream (new EC manifest), and then referring to the new stream instead of the old when serving requests for that resource.

In this simple example, FIG. 10 shows the new EC manifest in which erasure set metadata 580, 590 and 590' represents the original object and erasure set metadata 680 represents all of the insert data. FIG. 9 shows the newly created logical object 656 that includes data portions 1-7 of the original object, followed by a portion of data portion 8 (up until the split point), followed by newly inserted data portions 13 and 14, next followed by the remaining portion of data portion 8 (after the split point), and finally by data portions 9-12. Note that the segment identifiers 589 and 599 of the original erasure sets of the original object remain unchanged in the new EC manifest of FIG. 10. The only new segment identifiers are identifiers 699 representing the insert data.

Overwrite Operation Example

Should a client application wish to overwrite data onto an original object stored in Object Storage, first, enumerable erasure sets (or a set) are created to contain the data for the overwrite data (including computing parity segments as needed), then references to the newly created erasure set (or sets) are inserted into the erasure-coding (EC) manifest for the original object and any existing erasure sets in the EC manifest that have been completely overwritten are removed. No existing data is moved or copied in the process. In this example, the phrase "overwrite data" refers to the new data can overwrite old data, or to data that may be added to the end of the logical object, or to data that may even be added past the end of the logical object.

An overwrite operation may be accomplished in a similar manner as an insert operation. The new overwrite data is placed into one or more erasure sets, and then in the existing EC manifest these new erasure sets are inserted in a location corresponding to the beginning and end of the data to be overwritten. Intervening erasure sets (not having a begin or end point in the overwrite data) can be discarded. If the beginning point for the overwrite data corresponds to an erasure set boundary, then the metadata for the erasure sets created in the overwrite operation can simply be inserted at that boundary. Otherwise, an existing erasure set in the EC manifest is "split" as in the insert operation, resulting in the metadata of the split erasure set being specified as a range which references only the first part of that erasure set to be retained. The metadata of the overwrite data erasure set (or sets) is then inserted after that split erasure set metadata. If the end point of the overwrite data is also not at an erasure set boundary, a second split is done, modifying the metadata of the erasure set containing the end point so that the end point becomes the beginning of the data in that split erasure set. Thus, the resulting logical object described by the EC manifest consists of the data from the beginning of the object to the beginning of the overwrite data, then the overwrite data itself, followed by the data from the end of the overwrite point to the end of the object.

Figure 11:
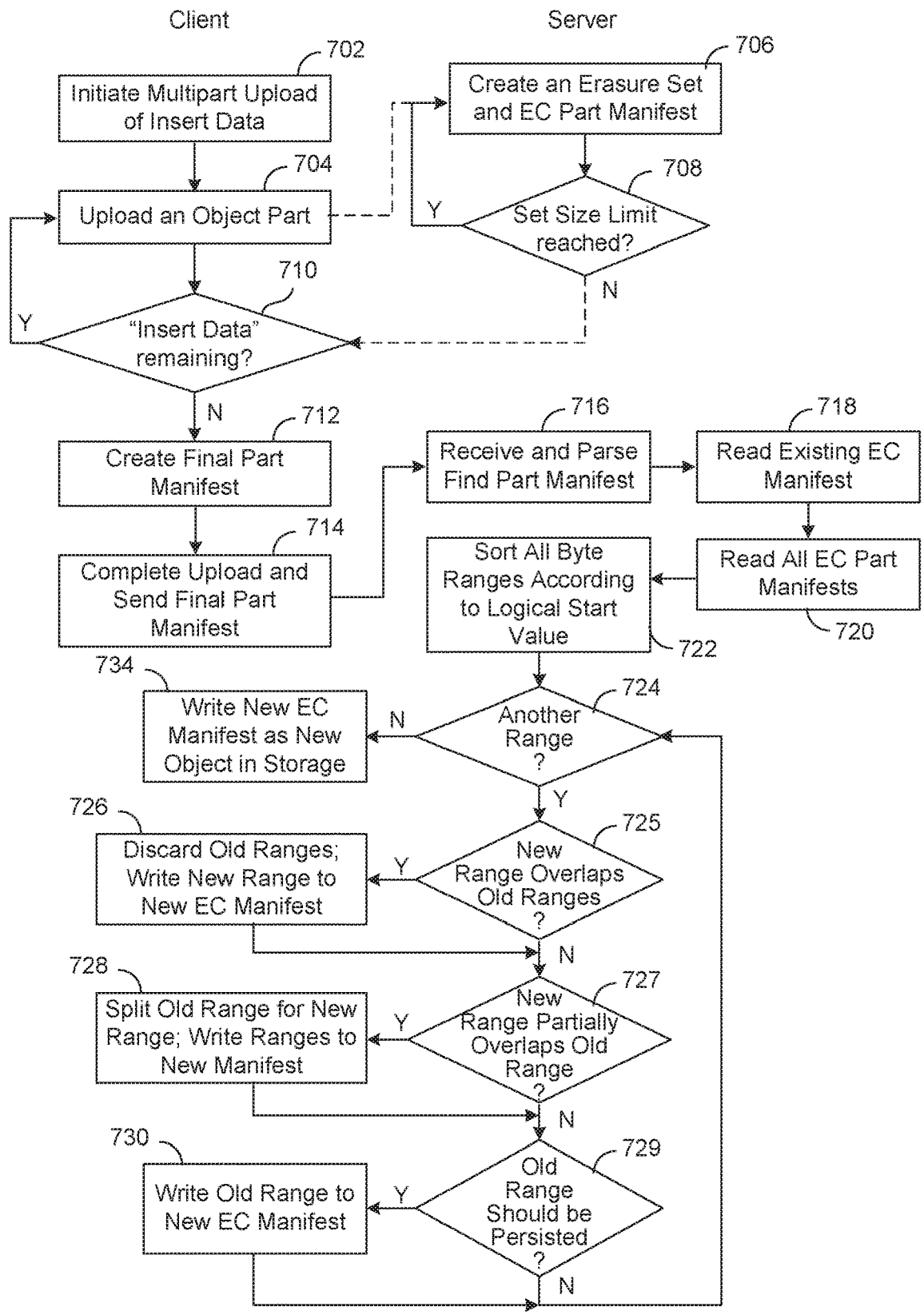
FIG. 11 is a flow diagram describing one embodiment of the overwrite operation.
Figure 12:
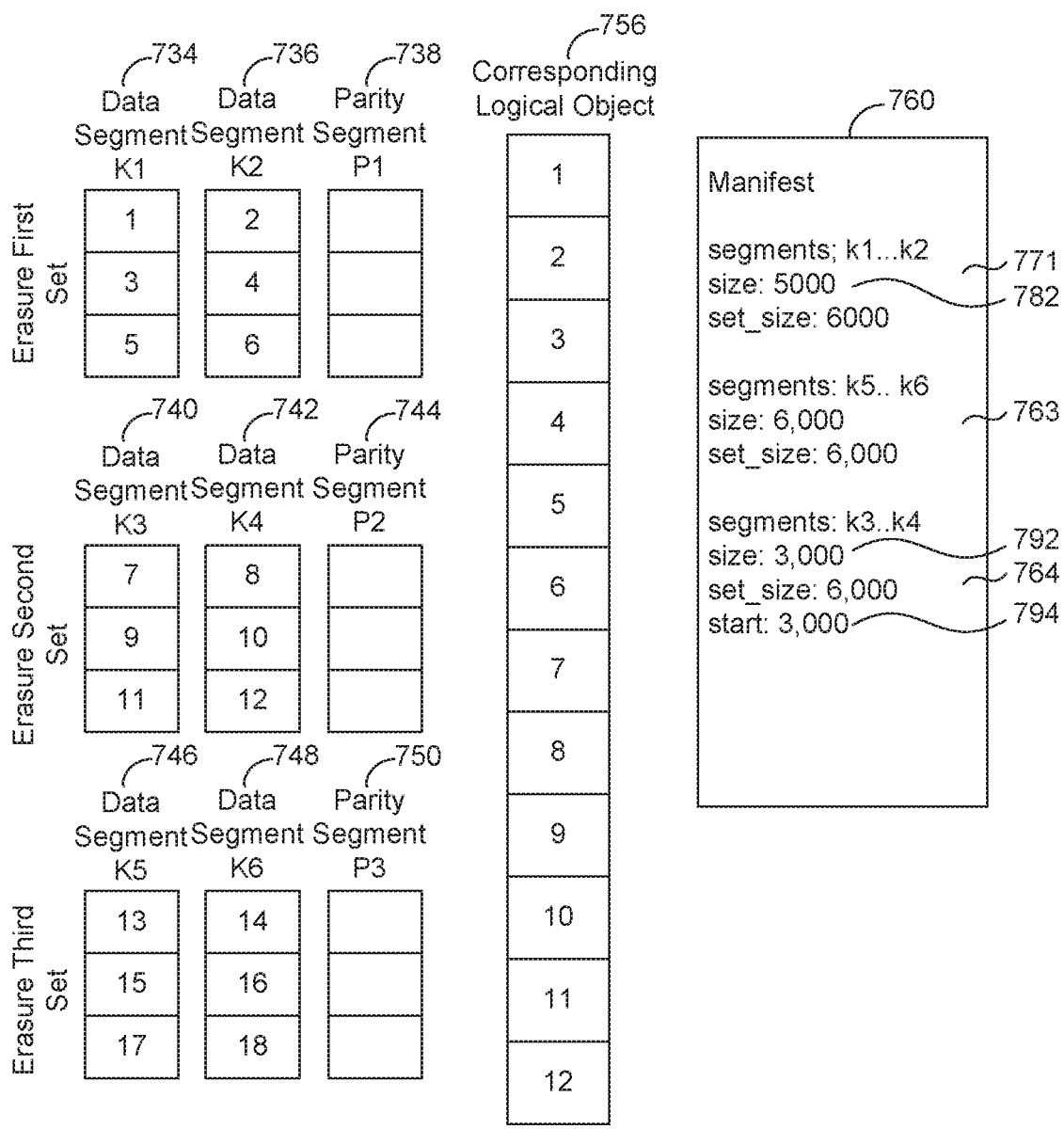
FIG. 12 is a block diagram showing symbolically the erasure sets, logical object and EC manifest after the overwrite operation.

FIG. 11 is a flow diagram describing one embodiment of the overwrite operation. FIG. 12 is a block diagram showing symbolically the erasure sets, logical object and EC manifest after the overwrite operation. FIG. 13 illustrates in more detail the new EC manifest after the overwrite operation. These figures will be referred to in the below discussion of the append operation.

Consider the example of erasure sets of FIG. 9 in which an existing object in Object Storage includes three erasure sets as shown, and it is desired to overwrite data. Should the client application wish to overwrite data in the logical object beginning at a point 755 of FIG. 12 (a point between portions 5 and 6), first, the reference to the first erasure set 734-738 is maintained in the manifest. Then, a reference to the starting point of the data in that first erasure set is added by indicating that the data size 782 is only 5,000 instead of 6,000. Next, the bytes to be inserted are written into one or more erasure sets (in this example these are segments 746, 748, 750, corresponding to portions 13-18, including parity segments), and a reference to this new erasure set 763 is inserted into the manifest as shown. Then, a reference to the end point of the data in the second erasure set 664 is added by indicating that the data size 792 is only 3,000 instead of 3,000 and that the start point 794 for reading data from this erasure set is at byte 3,000. After this is done, if the logical stream is read, the overwritten bytes will appear in the proper location. Note that the segment UUIDs for erasure sets one and two are not changed.

FIG. 11 is a flow diagram describing the overwrite operation and steps 702-718 are similar to corresponding steps from FIGS. 5 and 8. In step 718, the EC manifest of the existing object is read. Steps 720-734 will be understood by one of skill in the art upon a reading of this disclosure. These steps take the newly specified byte ranges and merge them into (or overwrite them onto) the old byte ranges of the logical object. Thus, a new range can either fully overwrite an old range, partially overwrite an old range, may fit entirely inside an old range, or may be added as a new range, and of course any given new range may do several of those things. As shown in FIG. 11, we start at the beginning and move sequentially through both old and new ranges, building the eventual, new logical object and finally create the new EC manifest in step 734.

More specifically, in step 716 we parse the final manifest, then read the existing EC manifest in step 718. In step 720 we read all EC part manifests and then sort all ranges according to logical start value in step 722. Next, in step 724 if there is another range then in step 725 we check whether the new range completely overlaps any old ranges. If so, then in step 726 we discard old ranges, and write the new range to new EC manifest. If not, then in step 727 we check if the new range partially overlaps an old range. If so, then in step 728 we split the old range to accommodate the new range, and write all resulting ranges to the new EC manifest. It not, then in step 729 we check if the old range should be persisted. If so, then in step 730 we write the old range to new EC manifest; if not, then control returns to step 724. If there is no other range, then in step 734 we save new EC manifest as a new object.

At this point, the new EC manifest that has been created in the above steps represents not only the original object but all overwrite data that has been written into that object. In step 734 this new EC manifest is written as a new object into Object Storage (i.e., onto disk of one of the computer nodes of FIG. 1); a unique identifier is created for this new EC manifest and this identifier is returned to the client application so that the client application now has a unique identifier representing the original object into which the insert data has been inserted.

Preferably, updates such as this overwrite operation are made by creating a new stream (new EC manifest), and then referring to the new stream instead of the old when serving requests for that resource.

In this simple example, FIG. 13 shows the new EC manifest in which erasure set metadata 580' and 590" represents the original object and erasure set metadata 780 represents all of the overwrite data. FIG. 12 shows the newly created logical object 756 that includes data portions 1-5 of the original object, followed by new overwrite data portions 13-18, and finally followed by the remaining portions 10-12. Note that the segment identifiers 589 and 599 of the original erasure sets of the original object remain unchanged in the new EC manifest of FIG. 13. The only new segment identifiers are identifiers 750 representing the overwrite data.

Merge Operation Example

A merge of two original objects in Object Storage can be accomplished by combining the references to erasure sets in two existing EC manifests in the order desired, so that a single resulting object will contains all data (or a subset of all the data) from the objects. One of the existing EC manifests may be modified or the references to the erasure sets from existing objects may be placed into a new EC manifest. If it is desired that not all of the data from both objects be incorporated, but rather a subset, a subset may be specified using ranges as described above for insert or overwrite. No existing data is moved or copied in the process.

Figure 14:
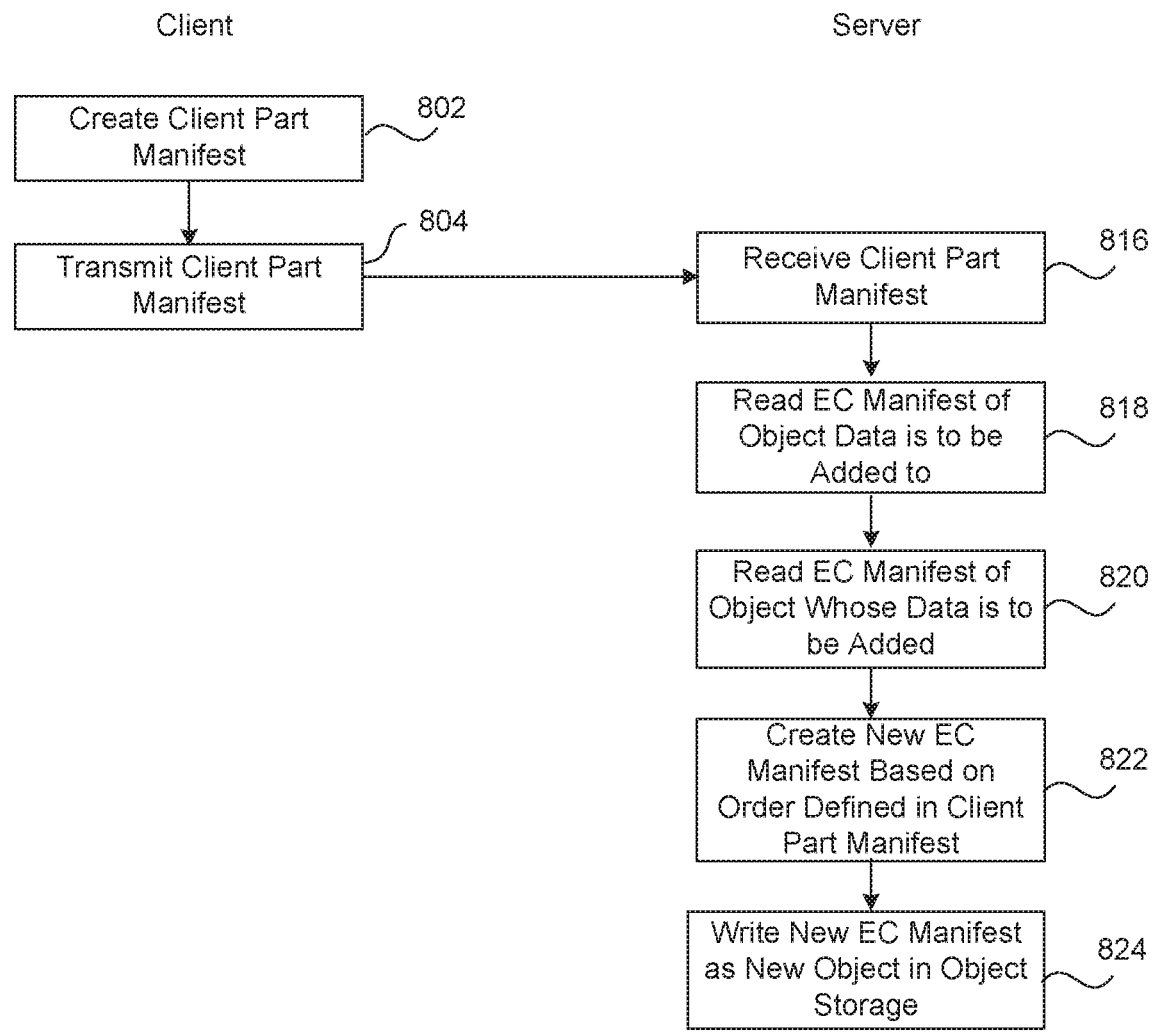
FIG. 14 is a flow diagram describing one embodiment of the merge operation.
Figure 15:
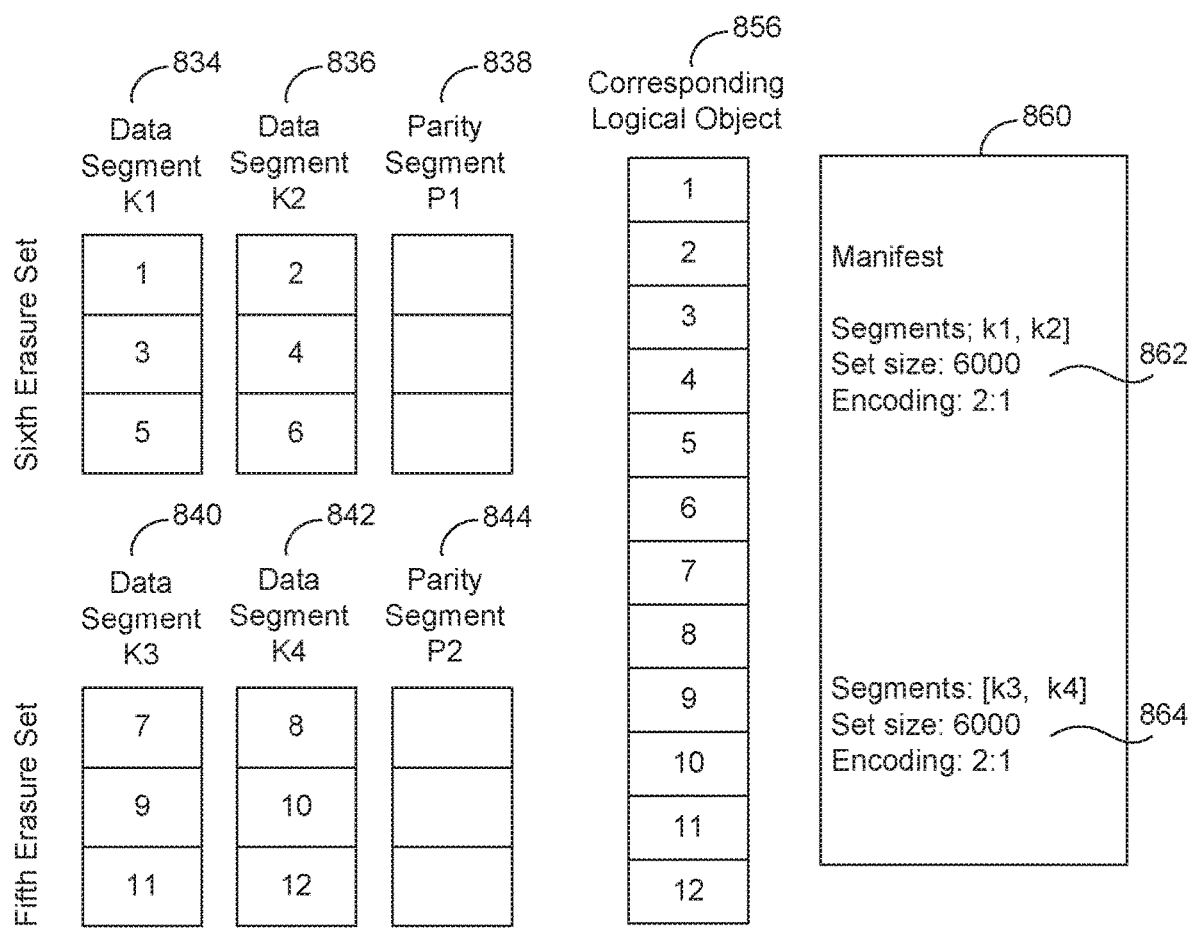
FIG. 15 is a block diagram showing symbolically the erasure sets, logical object and new EC manifest after the merge operation.

FIG. 14 is a flow diagram describing one embodiment of the merge operation. FIG. 15 is a block diagram showing symbolically the erasure sets, logical object and new EC manifest after the merge operation. FIG. 16 illustrates in more detail the new EC manifest after the merge operation. These figures will be referred to in the below discussion of the append operation.

In this example it is assumed that a first digital object in Object Storage is represented by a fifth erasure set and that a second digital object in Object Storage is represented by a sixth erasure set. It is desired to merge the two objects such that the second object is inserted at the beginning of the first object. A new EC manifest will be created, although it is also possible to use the existing EC manifest from the first object.

In step 802 the client application creates the client part manifest. The client application desires to merge a first digital object with a second digital object, both of which are stored within Object Storage and have been encoded using erasure coding. Accordingly, the client has access to a unique identifier for each of these objects which represents an erasure coding (EC) manifest for each. The client application decides how to merge the two objects (i.e., which object should be inserted before the other, whether or not all of the data from one object should be incorporated, etc.) and creates a client part manifest which may appear similar to manifest 990 of FIG. 20. In this example, only the unique identifiers are needed in this manifest and the order of the identifiers indicates the order in which the objects should appear in the final merged object. The client specifies that the second object appears first followed by the first object.

In step 804 the client part manifest is sent to the server. In step 816 the server receives the client part manifest from the client application. Next, in step 818 in order to merge both objects, the server obtains a unique identifier representing the EC manifest of the first object and reads that manifest from Object Storage in order to obtain the fifth erasure set 864 as shown in FIG. 15. Next, in step 820 the server obtains a unique identifier representing the EC manifest of the second object and reads that manifest from Object Storage in order to obtain the sixth erasure set 862 as shown in FIG. 15. These EC manifest may include any number of erasure sets each having different a different size, encoding, width, etc.

Next, in step 822 the server creates a new EC manifest based upon the order defined in the client part manifest that will includes both of the erasure sets. For example, a new EC manifest appears at 860 in FIG. 15 showing that the sixth erasure set of the second digital objects appears before the fifth erasure set of the first digital object, meaning that the corresponding logical object 856 appears as shown.

FIG. 16 shows the new EC manifest in more detail. Erasure set six 840 represents the second digital object which appears before erasure set five 850 representing the first digital object. Of course, if either of the first and second objects were to include more than one erasure set then these erasure sets would also appear in the EC manifest in order. If erasure set six had been added to the EC manifest for the first digital object then erasure set five would remain in place and its information would not change. Note that the segment unique identifiers 886 and 896 remain unchanged.

At this point, the EC manifest that has been created represents both digital objects. In step 824 this newly created EC manifest is written as a new object into Object Storage (i.e., onto disk of one of the computer nodes of FIG. 1); a unique identifier is created for this new EC manifest and this identifier is returned to the client application so that the client application now has a unique identifier representing the two digital objects that have been merged.

Preferably, updates such as this merge operation are made by creating a new stream (new EC manifest), and then referring to the new stream instead of the old when serving requests for that resource.

In this simple example, FIG. 16 shows the newly created EC manifest in which erasure sets 840 and 850 are the original erasure sets from the first and second digital objects. FIG. 15 shows the newly created logical object 856 that includes data portions 1-6 of the second original object and data portions 7-12 of the of the first original object.

Sparse Objects

An EC manifest may be constructed that has a portion or portions that do not correspond to any existing erasure set, e.g., a portion may be inserted between set 840 and set 850 of FIG. 16. These portions can be described explicitly by providing a start position, a length, and a fill pattern of bits. When the range of the logical object is read from the EC manifest that corresponds to this portion, a bit sequence consisting of multiple instances of the fill pattern will be returned, thus simulating the effect of having created an erasure set consisting entirely of multiple instances of that fill pattern.

These portions not corresponding to an existing erasure set can also simply be omitted from the EC manifest, that is, the client application can specify only sparse ranges (e.g., using fields in an erasure set such as data size, start, length, end, etc.) in the stream expecting that the gaps will be filled in automatically. These gaps are detected upon a read and a filler range will be specified, using a null byte (for example) as the fill pattern. Thus, when the portion of the logical object is read that corresponds to this omitted portion, a sequence consisting of multiple instances of a null byte will be returned.

FIG. 17 is an example of an EC manifest that shows a sparse object. In this example, an object that was generated by a client completion manifest that only specified logical bytes 0-100, 1000-1200 and 5000-5100 (for example) would create such a sparse object with this EC manifest (with random UUIDs).

Multipart/Parallel Upload Advantages

In the completion step of a multi-part upload, the client application provides a map of parts that it has already written, and the logical range that each byte from those parts will occupy in the final stream. This range is not strictly required in the final manifest of FIG. 20 (although it may be present). The range is shown in the temporary manifest of FIG. 19. In fact, there may be two final manifest formats. For POST, PUT and APPEND uploads, only the part number and UUID is specified, as shown in FIG. 20, since the entire part will be used in order (although the client may choose different orders). For a merge operation (or insert, overwrite), the starting offset and size can be specified both for the physical and logical range, as shown in FIG. 19 because the user has much greater control as to how the physical bytes map to the logical bytes.

Previously, in the prior art, each pail had to be used in its entirety, and had to be assembled into the logical stream as is, in order, with no gaps. Now, a single part may contain multiple disjoint ranges that can each be placed at any starting point in the logical stream, either as an insert, overwrite, or append. Further, client applications can specify logical ranges that do not correspond to an existing part at all, but specify defined byte patterns for a given length, which can be applied to the logical content in the same marine Finally, any gaps in the logical range that are present in the client map will be seamlessly filled in will a manifest set of null bytes.

Any data previously in a stream of an object and not specified in a range in a completion manifest is left untouched. Thus, implicit empty ranges in the completion manifest will not affect the stream unless they are past the end of the original object. This means that the completion manifest only has to describe what it is updating, not the whole stream.

Updates and operations are also atomic. The target object of an operation is never in an intermediate bad state as a result of any of the operations described above. Multiple updates and operations can be in progress at the same time, and do complete atomically, but their order of completion is important if they are updating the same range. It is possible to initiate multiple merge operations on the same target stream at the same time; each completion affects the stream as it exists at that time, and cannot be corrupted by any other in-progress operations. This is not preferable, but it can be done. When more than one range of an erasure set is referenced in an EC manifest, these ranges can be overlapping, non-contiguous and in any order.

During the construction or update of these multi-part objects, order of upload is unimportant and parts can be uploaded in parallel. Objects with multi-part uploads in progress are fully usable at all times; the logical content of the object will be as described in the EC manifest at the time it is accessed. A part which has been uploaded but which is not yet represented in the EC manifest will not have its content represented in the logical object until the manifest has been updated.

Multi-Part Upload System

As mentioned above, the present invention may append, insert, overwrite or merge digital objects while making use of a multi-part upload technique, disclosed in the application of "MULTI-PART UPLOAD" which is incorporated by reference above. The multi-part upload technique allows files or digital objects to be uploaded in multiple parts, possibly in parallel, without regard to the order of uploading, without needing to cache or stage files or blocks of data on a local permanent storage, and allows a single part of an object in object storage to be updated. Use of this technique may take place in steps 502-514 of FIG. 5, in steps 602-614 of FIG. 8, in steps 702-714 of FIG. 11, and in steps 802-804 of FIG. 14. The below describes such a multi-part upload system in more detail.

Figure 18:
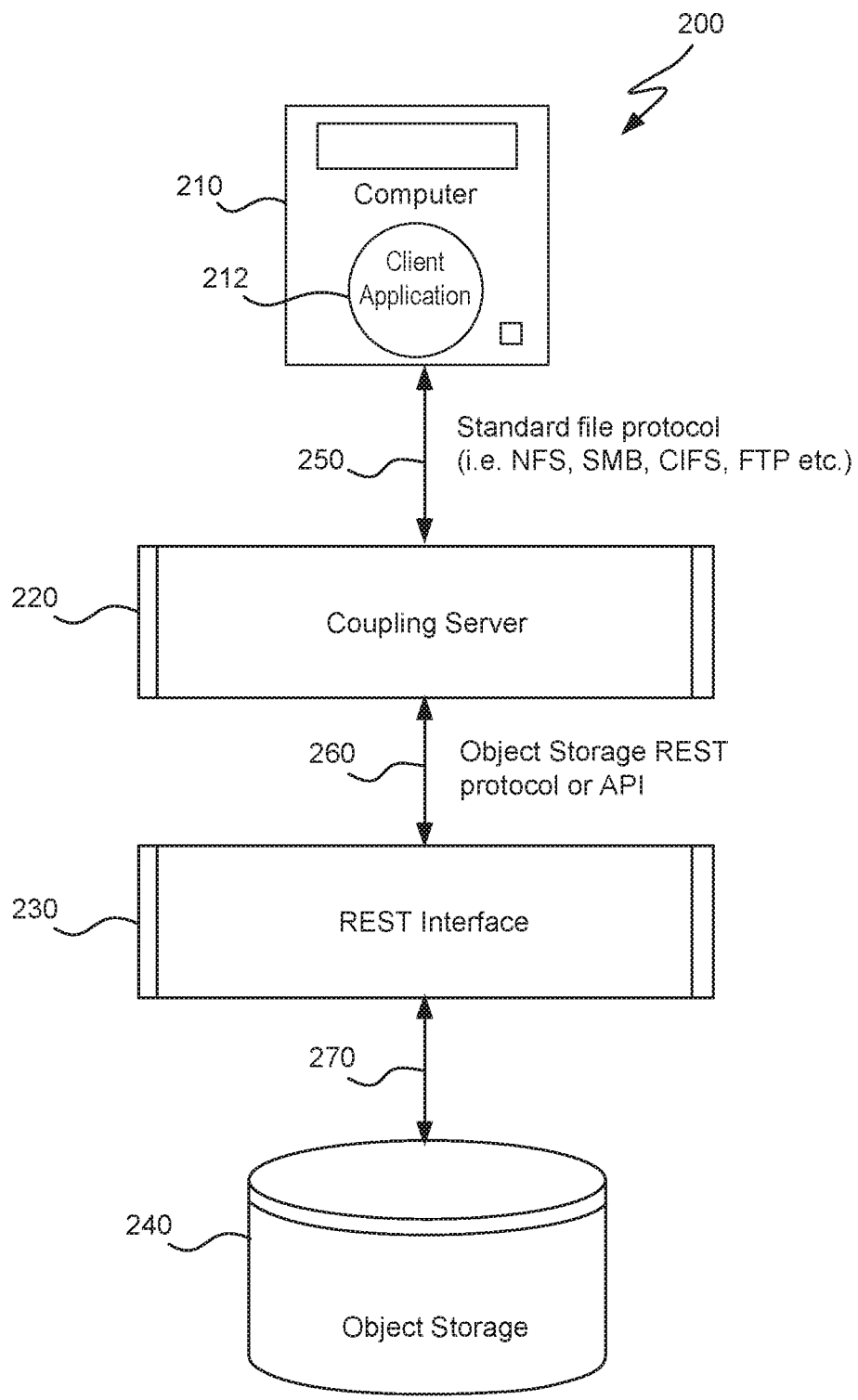
FIG. 18 is a block diagram of a multi-part upload system.

FIG. 18 is a block diagram of a multi-part upload system 900. Included are a computer 910, a coupling server 920, a REST interface 930 and object storage 940. Computer 910 may be any suitable computer executing a client application 912 such as an enterprise server computer, personal or business desktop or laptop computer, or a mobile device such as a telephone or tablet. Client application 912 is any suitable application able to issue file system commands including applications such as Linux mount, Linux shells such as bash, Windows drive mapping, Windows Explorer, Mac OS finder, or applications such as media streamers, document management systems and archiving applications Coupling server 920 is any suitable server software able to execute the processes described below; server 920 may execute upon any suitable computer, including computer

910, and may be written in programming languages such as C, C#, C++, Objective-C, Swift, Python, GO, Java, JavaScript, PHP and Perl.

REST interface 930 is an Application Programming Interface (API) presented by the Object Storage system to object storage client applications in order to create, read, modify and manage data objects. REST is a common form of an API, but other APIs do exist such a SOAP, which may also be used. Object storage 940 is any suitable object storage system existing upon suitable computer hardware such as hard drives, solid-state disks, flash storage, etc., and may include an object storage system such as Caringo Swarm, Amazon S3, DDN, HDS, Openstack Swift, IBM Cloud Object Storage and Scality.

In operation, client application 912 communicates using a standard file system protocol 950 (such as NFS, SMB, CIFS, FTP, etc.) with coupling server 920. Coupling server 920, in turn, then communicates with the object storage using a REST interface over a network protocol such as HTTP or other suitable object-storage-offered API 930. The REST interface then communicates with object storage 940 using any internal object storage protocol 970. REST is a common form of a API, but others do exist such a SOAP. Protocol 960 is the network protocol used by the coupling server to connect to the object storage REST interface; the most common network protocol used is HTTP.

Available to the client application 912 or user is a file system, with the traditional hierarchical namespace and the standard operations to open or delete a file that already exists, to create a new file that does not yet exist, to list a subset of files, and to read data from or to write data to an opened file. The embodiments described below describe implementations of these file system operations on an object store using techniques of the present invention.

The coupling server is capable of storing logical predicates, and maintains a list of open files by name or file describer, each with associated file properties, and each with an associated object name or identifier in the storage cluster, and the object's metadata. The coupling server also keeps a list of all active parallel write sessions (the coupling server typically does not need to keep a note of read sessions as reads are always single transactions) along with their temporary part order manifests. The coupling server receives a read request (for example) from a client application over a traditional file system protocol (such as NFS, SMB, CIFS, FTP, etc.) and translates the request into the required object storage REST protocol or API call. The coupling server then translates information and data retrieved from the object storage back into the client's file system protocol and returns the data back to the client application. Advantageously, the coupling server uses parallel uploads to store file bytes received over a traditional file system protocol in any order as described below, or to read file bytes as described below.

FIG. 19 shows a temporary part order manifest 980 and its use will be described in greater detail below. When data blocks of any length are received from a client application over a traditional file system protocol a process on the coupling server creates parallel upload object parts which contain the data received. These object parts may be temporary or may later become permanent objects and are stored within the object storage.

While the parallel upload session is active the process keeps a list of all parallel upload object parts that have been created; this list is described in the temporary part order manifest. The temporary part order manifest may be stored in RAM, in flash memory, on a solid-state drive, in a traditional block on the coupling server or within the object storage, and may be stored as a file, object or other data structure such as a b-tree or in a relational database. After completion of the parallel upload session the temporary part order manifest is discarded as it is no longer required. Parallel upload session completion occurs after the client application has indicated that it has finished writing the file data (for example, by issuing a file close), the coupling server has successfully uploaded all data to the object store, requested the object storage to complete the parallel upload, and the object storage has acknowledged back to the coupling server that the parallel upload has completed.

The contents of the temporary part order manifest 980 identify one object part per row and include: the part identifier 982, the start position offset (byte start location) of the data 984, the size of the part 986 and the identifier of the object part 988. In addition to or instead of size, the ending position offset of the data may be included. The identifier 988 may be a GUID (Globally Unique Identifier) or other unique identifier such as opaque object names. The rows of the temporary part order manifest may be stored in any order, for example, ordered by the start position offset of the data 984 or by the part identifier 982; there is no requirement that the contents of the temporary part order manifest be ordered in any particular way.

Parallel uploading (also known as multi-part uploading) is a call to a REST interface or other API that enables the upload of objects in parts to object storage. Parallel uploading is a three-step process: 1) initiate the upload, 2) upload the object parts, and after uploading all the parts, 3) complete the parallel upload. Upon receiving the complete parallel upload request, the object storage constructs the object from the uploaded parts and stores it; one may then access the object as one would any other object in the object storage.

Parallel uploading may be used to store byte ranges sent over traditional file system protocols (such as NFS, SMB, CIFS, FTP, etc.) without the requirement for staging or caching the received data; these byte ranges can be received in any order from the client application. Byte ranges received are stored as parallel upload object parts directly within the object store and a list of these parts are stored in a temporary part order manifest. If a read request is made by the client and data is requested that has previously been written during the current parallel upload session, then any data stored in the parallel upload object parts is returned to the client; if data is requested that was previously written to the object storage (through any object storage supported method, parallel upload or other) but has not been changed in the current parallel upload session, then the requested data is returned using the previous data in the object storage.

Upon receiving a "file close" or "file synchronization" command from the client, a parallel upload completion request is made to the object storage, resulting in a new object version being created by the object storage. This new version of the object then replaces the previous current version of the object to become the active current object version, that is, from that time on, the object storage will return data from the new current version for any read request while that version is still the current version.

If the close or synchronization request is for a file that is part of an active parallel upload session, then any object parts that are needed to create the complete and full new object that have not been written yet during the existing parallel upload session are now read from the current object version in object storage. The coupling server determines which data parts are missing by analyzing the temporary part manifest looking for gaps in the listed GUID byte ranges.

The coupling server 920 will create these object parts using the existing data in the object storage; it may read and then transfer the required data from the object storage itself or instruct the object storage of what data ranges to take from the existing object to create each missing part. The coupling server does not need to concern itself about which is the current version; the object storage system will do this automatically.

The GUID with start range and range size (or end) for each of these object parts that have just been created using data from the current object version is stored in the temporary part order manifest; the GUID is returned by the object storage system to the coupling server when the parts have been created. For example, if the object part having the unique identifier (GUID) shown in row 989 of FIG. 19 is read from object storage, then this row 158 of object part metadata will be written to the manifest. Once these missing object parts have been added to the manifest, a final parallel upload completion manifest is created from the temporary part order manifest.

FIG. 20 shows a final completion manifest using a suitable programming language. The contents of the manifest 990 identify one object part per entry and include: the part identifier 992 (e.g., part number 11), and the unique identifier of the object part 994 (e.g., UUID: bbaa8eaaf9f1575acee76573d3f85bd9). The identifier 994 may be a GUID (Globally Unique Identifier) or other unique identifier such as opaque object names FIG. 20 is a simple example. In an actual example, there would in fact be hundreds of more identifiers in the final manifest; both FIGS. 19 and 20 are extracts of what the temporary and final manifest look like. Further, the manifest 990 may also include the byte ranges 984 and 986 for each part shown in the temporary manifest of FIG. 19.

This final manifest lists all object parts in the correct order required in order to stitch them together to form the complete new object version. The coupling server sends the final parallel upload completion manifest to object storage 940 along with a parallel completion operation using the object storage REST protocol or a suitable API command "complete parallel upload operation."

Finally, object storage 940 creates a new object version corresponding to the final manifest that contains all of the data stored in the correct ascending byte order as listed in the final manifest. The object storage system will then automatically handle all management of prior object versions, new object version, identification, etc.

COMPUTER SYSTEM EMBODIMENT

Figure 21A:
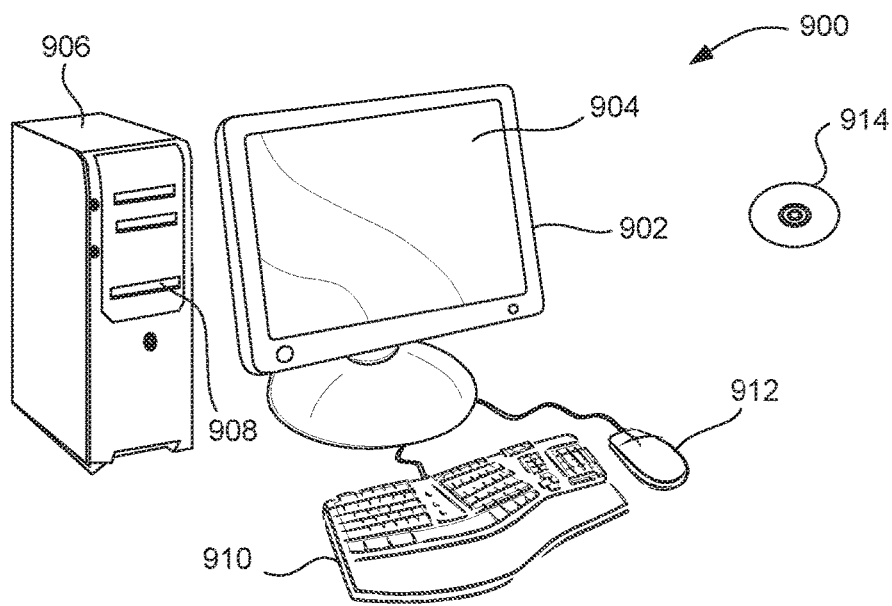
FIGS. 21A and 21B illustrate a computer system suitable for implementing embodiments of the present invention.
Figure 21B:
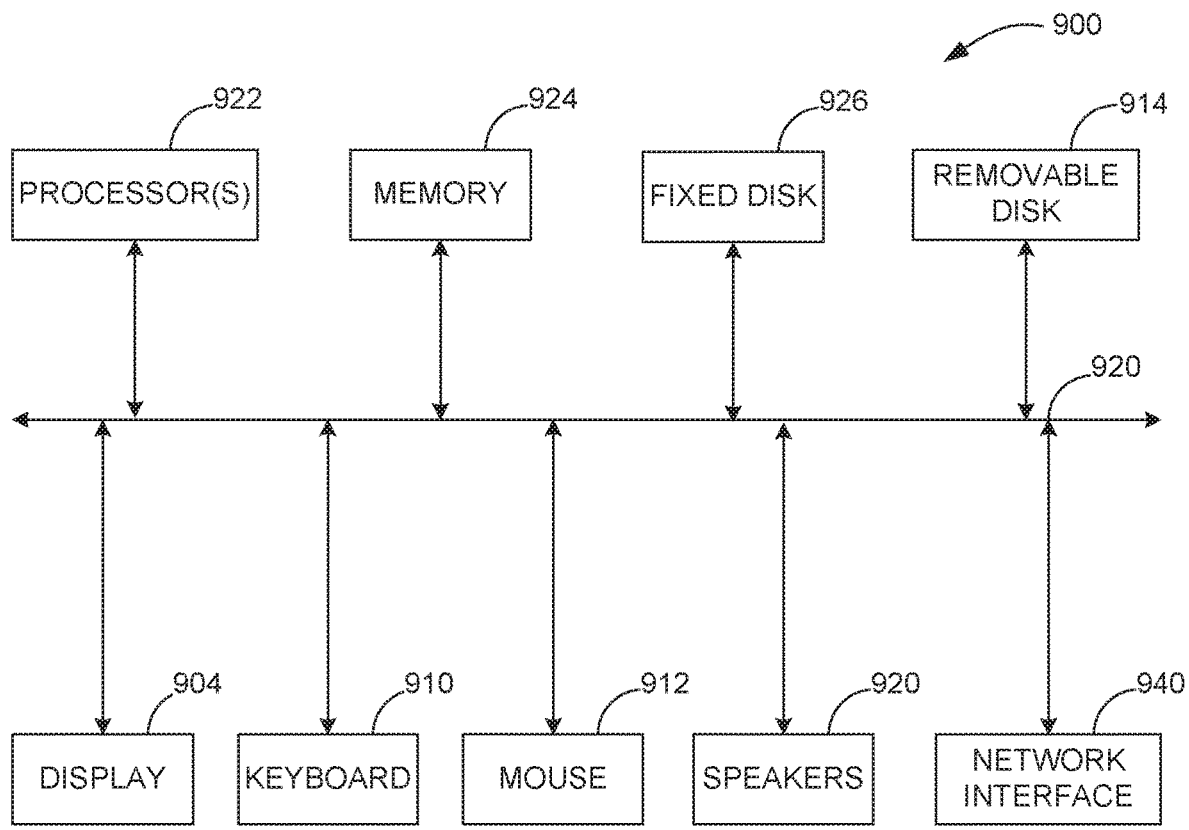

FIGS. 21A and 21B illustrate a computer system 900 suitable for implementing embodiments of the present invention. FIG. 21A shows one possible physical form of the computer system. Of course, the computer system may have many physical forms including an integrated circuit, a printed circuit board, a small handheld device (such as a mobile telephone or PDA), a personal computer or a super computer. Computer system 900 includes a monitor 902, a display 904, a housing 906, a disk drive 908, a keyboard 910 and a mouse 912. Disk 914 is a computer-readable medium used to transfer data to and from computer system 900.

FIG. 21B is an example of a block diagram for computer system 900. Attached to system bus 920 are a wide variety of subsystems. Processor(s) 922 (also referred to as central processing units, or CPUs) are coupled to storage devices including memory 924. Memory 924 includes random access memory (RAM) and read-only memory (ROM). As is well known in the art, ROM acts to transfer data and instructions uni-directionally to the CPU and RAM is used typically to transfer data and instructions in a bi-directional manner Both of these types of memories may include any suitable of the computer-readable media described below. A fixed disk 926 is also coupled bi-directionally to CPU 922; it provides additional data storage capacity and may also include any of the computer-readable media described below. Fixed disk 926 may be used to store programs, data and the like and is typically a secondary storage medium (such as a hard disk) that is slower than primary storage. It will be appreciated that the information retained within fixed disk 926, may, in appropriate cases, be incorporated in standard fashion as virtual memory in memory 924. Removable disk 914 may take the form of any of the computer-readable media described below.

CPU 922 is also coupled to a variety of input/output devices such as display 904, keyboard 910, mouse 912 and speakers 930. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 922 optionally may be coupled to another computer or telecommunications network using network interface 940. With such a network interface, it is contemplated that the CPU might receive information from the network, or might output information to the network in the course of performing the above-described method steps. Furthermore, method embodiments of the present invention may execute solely upon CPU 922 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher-level code that are executed by a computer using an interpreter.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

We claim:

1. A method of appending append data to a digital object stored in object storage, said method comprising:
receiving said append data from a client application at a computer node of a storage cluster;
storing said append data in object storage of said storage cluster;

creating an erasure-coding part manifest to represent said append data and returning a unique identifier of said erasure-coding part manifest to said client application;

receiving from said client application a final part manifest that includes said unique identifier of said erasure-coding part manifest and a unique identifier of an erasure-coding manifest representing said digital object in said object storage;

creating a new erasure-coding manifest including any erasure sets of said digital object erasure-coding manifest followed by any erasure sets of said erasure-coding part manifest; and storing said new erasure-coding manifest in said object storage to represent said append data appended to said digital object.

2. A method as recited in claim 1 and wherein no data of said digital object or of said append data need be copied within said storage cluster or within said object storage in order to create said new erasure-coding manifest.

3. A method as recited in claim 1 wherein said append data is stored in within said object storage using an erasure coding technique and said erasure-coding part manifest includes at least one erasure set that identifies erasure-coding segments of said append data.

4. A method as recited in claim 1 wherein said append data is stored within said object storage as a replicated stream and said erasure-coding part manifest includes at least one erasure set that identifies said append data with a single unique identifier.

5. A method as recited in claim 1 wherein said final part manifest includes a start location and a size corresponding to said unique identifier of said erasure-coding part manifest indicating where within said digital object to said append data should be appended.

6. A method as recited in claim 1 wherein said final part manifest includes a plurality of unique identifiers each representing an erasure-coding part manifest, each of said erasure-coding part manifests identifying a portion of said append data.

7. A method as recited in claim 1 wherein said final part manifest includes a missing part unique identifier representing a portion of said append data that has not been received from said client application, said method further comprising:

retrieving said portion of said append data using said missing part unique identifier from said object storage.

8. A method of inserting insert data into a digital object stored in object storage, said method comprising:

receiving said insert data from a client application at a computer node of a storage cluster;

storing said insert data in object storage of said storage cluster;

creating an erasure-coding part manifest to represent said insert data and returning a unique identifier of said erasure-coding part manifest to said client application;

receiving from said client application a final part manifest that includes said unique identifier of said erasure-coding part manifest, a unique identifier of an erasure-coding manifest representing said digital object in said object storage, and an indication of an insert location within said digital object of where to insert said insert data;

creating a new erasure-coding manifest including any erasure sets of said digital object erasure-coding manifest;

duplicating one of said erasure sets of said digital object erasure-coding manifest in said new erasure-coding manifest that includes said insert location;

inserting any erasure sets of said erasure-coding part manifest between said duplicated erasure sets in said new erasure-coding manifest; and storing said new erasure-coding manifest in said object storage to represent said insert data inserted into said digital object.

9. A method as recited in claim 8 and wherein no data of said digital object or of said insert data need be copied within said storage cluster or within said object storage in order to create said new erasure-coding manifest.

10. A method as recited in claim 8 wherein said insert data is stored in within said object storage using an erasure coding technique and said erasure-coding part manifest includes at least one erasure set that identifies erasure-coding segments of said insert data.

11. A method as recited in claim 8 wherein said insert data is stored within said object storage as a replicated stream and said erasure-coding part manifest includes at least one erasure set that identifies said insert data with a single unique identifier.

12. A method as recited in claim 8 wherein said final part manifest includes a start location and a size corresponding to said unique identifier of said erasure-coding part manifest indicating where within said digital object said insert data should be inserted.

13. A method as recited in claim 8 wherein said final part manifest includes a plurality of unique identifiers each representing an erasure-coding part manifest, each of said erasure-coding part manifests identifying a portion of said insert data.

14. A method as recited in claim 8 wherein said final part manifest includes a missing part unique identifier representing a portion of said insert data that has not been received from said client application, said method further comprising:

retrieving said portion of said insert data using said missing part unique identifier from said object storage.

15. A method as recited in claim 8 wherein said new erasure-coding manifest includes an indication in each of said duplicated erasure sets of a beginning or an end point of said insert data.

16. A method of overwriting overwrite data onto a digital object stored in object storage, said method comprising:

receiving said overwrite data from a client application at a computer node of a storage cluster;

storing said overwrite data in object storage of said storage cluster;

creating an erasure-coding part manifest to represent said overwrite data and returning a unique identifier of said erasure-coding part manifest to said client application;

receiving from said client application a final part manifest that includes said unique identifier of said erasure-coding part manifest, a unique identifier of an erasure-coding manifest representing said digital object in said object storage, and an indication of an overwrite start location within said digital object of where to overwrite said overwrite data;

creating a new erasure-coding manifest including all erasure sets of said digital object erasure-coding manifest;

inserting all erasure sets of said erasure-coding part manifest between erasure sets in said new erasure-coding manifest;

removing at least one of said all erasure sets of said digital object erasure-coding manifest from said new erasure-coding manifest that is overwritten by said overwrite data; and storing said new erasure-coding manifest in said object storage to represent said overwrite data overwritten into said digital object.

17. A method as recited in claim 16 and wherein no data of said digital object or of said overwrite data need be copied within said storage cluster or within said object storage in order to create said new erasure-coding manifest.

18. A method as recited in claim 16 wherein said overwrite data is stored in within said object storage using an erasure coding technique and said erasure-coding part manifest includes at least one erasure set that identifies erasure-coding segments of said overwrite data.

19. A method as recited in claim 16 wherein said overwrite data is stored within said object storage as a replicated stream and said erasure-coding part manifest includes at least one erasure set that identifies said overwrite data with a single unique identifier.

20. A method as recited in claim 16 wherein said final part manifest includes a start location and a size corresponding to said unique identifier of said erasure-coding part manifest indicating where within said digital object said overwrite data should be overwritten.

21. A method as recited in claim 16 wherein said final part manifest includes a plurality of unique identifiers each representing an erasure-coding part manifest, each of said erasure-coding part manifests identifying a portion of said overwrite data.

22. A method as recited in claim 16 wherein said final part manifest includes a missing part unique identifier representing a portion of said overwrite data that has not been received from said client application, said method further comprising:
retrieving said portion of said overwrite data using said missing part unique identifier from said object storage.

23. A method as recited in claim 16 wherein said new erasure-coding manifest includes an indication in each of the erasure sets before and after said all erasure sets of said erasure-coding part manifest of a beginning or an end point of said overwrite data.

24. A method of merging a first digital object stored in object storage with a second digital object stored in object storage, said method comprising:

storing said first digital object in said object storage using erasure coding and returning a first unique identifier of a first erasure-coding manifest of said first digital object to a client application;

storing said second digital object in said object storage using erasure coding and returning a second unique identifier of a second erasure-coding manifest of said second digital object to said client application;

receiving from said client application at a computer node of a storage cluster a final part manifest that includes said first and second unique identifiers in a particular order;

reading said first and second erasure-coding manifests from object storage using said first and second unique identifiers;

creating a new erasure-coding manifest including all erasure sets of said first erasure-coding manifest and all erasure sets of said second erasure-coding manifest in said particular order specified in said final part manifest; and storing said new erasure-coding manifest in said object storage to represent a new digital object representing said first digital object merged with said second digital object.

25. A method as recited in claim 24 and wherein no data of said first or second digital object need be copied within said storage cluster or within said object storage in order to create said new erasure-coding manifest.

26. A method as recited in claim 24 wherein said final part manifest includes a start location and a size corresponding to said first unique identifier indicating a portion of said first digital object to be included in said new digital object, said method further comprising:
editing one of said erasure sets of said first erasure-coding manifest to include said start location and said size.

27. A method as recited in claim 24 wherein said final part manifest includes a plurality of unique identifiers in a particular order each representing an erasure-coding manifest of a digital object stored in said object storage, said method further comprising:
creating said new erasure-coding manifest including all erasure sets of each of said erasure-coding manifests in said particular order specified in said final part manifest.

\* \* \* \* \*